US010399018B2

(12) United States Patent
Liao

(10) Patent No.: US 10,399,018 B2
(45) Date of Patent: Sep. 3, 2019

(54) LIQUID SUPPLY SYSTEM AND METHOD

(71) Applicant: TAIWAN SEMICONDUCTOR MANUFACTURING COMPANY, LTD., Hsinchu (TW)

(72) Inventor: Wen-Huang Liao, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 455 days.

(21) Appl. No.: 13/969,303

(22) Filed: Aug. 16, 2013

(65) Prior Publication Data

US 2015/0048035 A1  Feb. 19, 2015

(51) Int. Cl.
*B01D 35/02* (2006.01)
*H01L 21/67* (2006.01)

(52) U.S. Cl.
CPC ........ *B01D 35/02* (2013.01); *H01L 21/67017* (2013.01)

(58) Field of Classification Search
None
See application file for complete search history.

(56) References Cited

U.S. PATENT DOCUMENTS

| | | | | | |
|---|---|---|---|---|---|
| 5,900,045 | A | * | 5/1999 | Wang | B01D 19/0068 95/241 |
| 5,989,317 | A | * | 11/1999 | Huang | B01D 19/0068 95/241 |
| 6,171,367 | B1 | * | 1/2001 | Peng | B01D 19/0031 210/188 |
| 6,402,821 | B1 | * | 6/2002 | Matsuyama | B01D 19/0031 96/175 |
| 6,500,242 | B2 | * | 12/2002 | Fu | B01D 19/0005 96/157 |
| 2004/0144736 | A1 | * | 7/2004 | Yajima | B01D 19/0068 210/805 |
| 2005/0224132 | A1 | * | 10/2005 | Jang | H01L 21/6715 141/1 |
| 2008/0230492 | A1 | * | 9/2008 | Kao | G03F 7/162 210/791 |

OTHER PUBLICATIONS

"Machine Translation of JP2010135535A", Kosho et al., published 2010, 42 total pages.*
"Machine Translation of JP2001077015", Minami et al., published 2001, 54 total pages.*
"Hydraulics and Pneumatics", Bud Trinkel, Book 2, Chapter 8: Directional Control Valves, http://www.hydraulicspneumatics.com/other-technologies/book-2-chapter-8-directional-control-valves, 2008, 49 total pages.*
"Translation of JP201123866", Kosho et al., published 2011, 43 total pages.*

* cited by examiner

*Primary Examiner* — Jonathan M Peo
(74) *Attorney, Agent, or Firm* — Hauptman Ham, LLP

(57) ABSTRACT

A liquid supply system includes a container containing a liquid, a tank coupled to the container to receive the liquid from the container, and a dispensing mechanism coupled to the tank to receive the liquid to be dispensed. The dispensing mechanism comprises a filter configured to filter the liquid before dispensing. The filter comprises a first gas collection space configured to collect gas accompanying the liquid. The tank is controllably coupled to the first gas collection space of the filter to vent the collected gas from the filter to the tank.

20 Claims, 15 Drawing Sheets

LIQUID SUPPLY SYSTEM AND METHOD

BACKGROUND

Semiconductor manufacturing uses various types of liquid for processing wafers to form integrated circuits (ICs) thereon. Generally, a liquid for wafer processing is delivered from a supply vessel to wafer processing equipment via a supply system. The supply system is configured to deliver the liquid from the supply vessel to the wafer processing equipment, with considerations of ensuring a predetermined quality of the liquid delivered to the wafer processing equipment.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
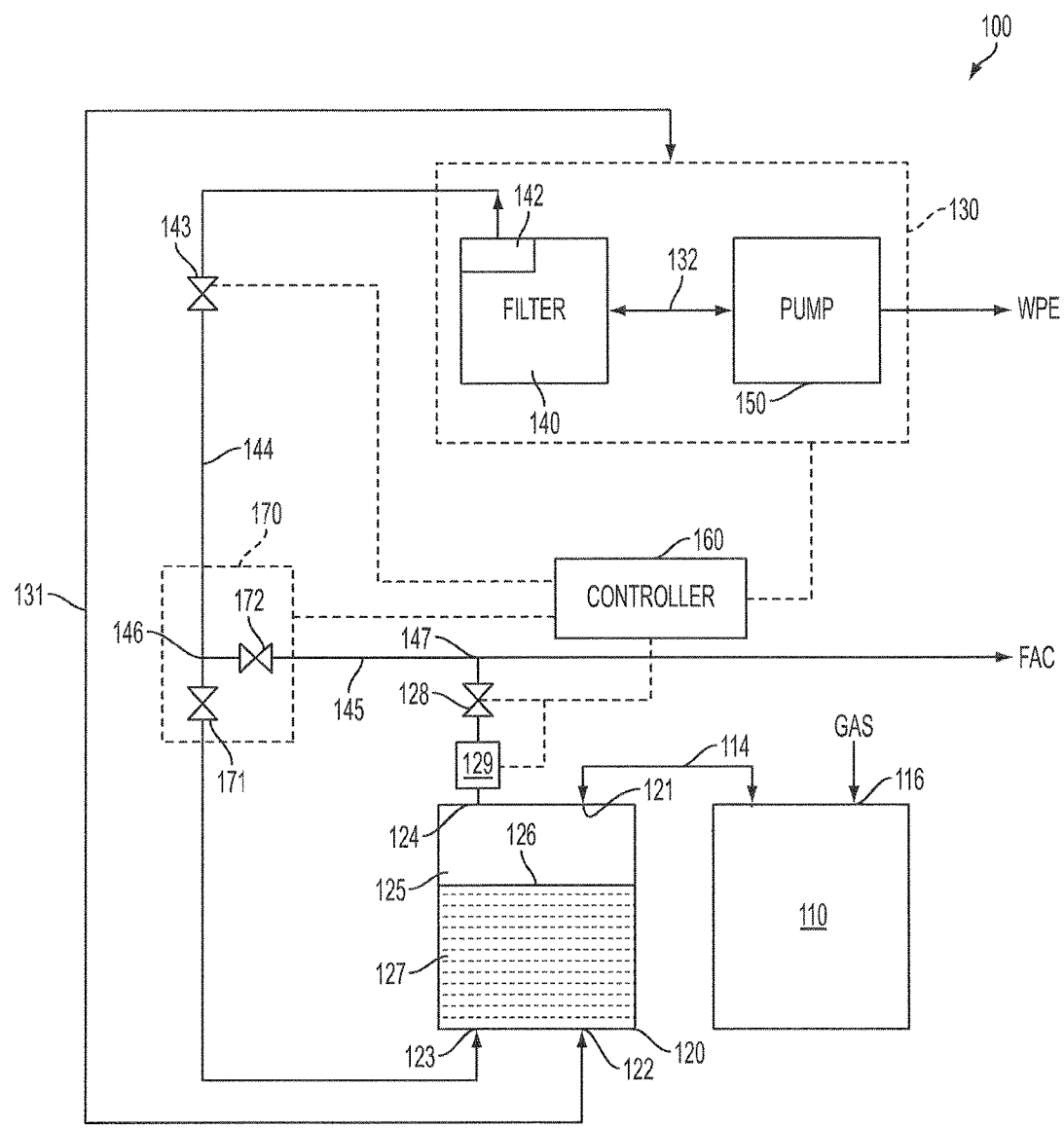
FIG. 1 is a schematic diagram of a liquid supply system in accordance with some embodiments.

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent; however, that one or more embodiments may be practiced without these specific details. Like reference numerals in the drawings denote like elements.

It is possible that a quality of a liquid delivered to a wafer processing equipment is affected by the presence of gas accompanying the liquid. For example, it is possible that gas is trapped, in the form of bubbles, in the delivered liquid. When the liquid is dispensed onto a wafer, such bubbles potentially cause a degradation in quality and/or uniformity of a coating of the liquid on the wafer which, in turn, potentially causes further manufacturing defects and/or affects the manufacturing yield. Elimination, or at least reduction, of gas accompanying the liquid is expected to raise the quality and/or yield of manufactured products.

In some embodiments, a liquid supply system comprises a tank for supplying a liquid to a dispensing mechanism configured to dispense the liquid. The dispensing mechanism has a filter for filtering the liquid before dispensing the filtered liquid, e.g., to wafer processing equipment. The filter has a first gas collection space for collecting gas accompanying the liquid. As a result, an amount of gas accompanying the filtered liquid is reduced. The collected gas in the first gas collection space is vented outside the filter to prevent the collected gas from re-entering the filtered liquid. It is possible that, when the collected gas is vented, an amount of the liquid is also moved out of the filter. In some embodiments, the collected gas is vented from the filter to the tank. As a result, a potential waste of the liquid vented together with the collected gas is reduced. In one or more embodiments, the tank has a second gas collection space to collect the gas vented from the filter to the tank. In at least one embodiment, when an amount of the gas collected in the second gas collection space reaches a predetermined level, the collected gas in the tank is vented outside, either automatically or manually. As a result, improved liquid and/or product quality is achievable without excessively wasting the liquid. In some embodiments, the described arrangement is applicable to various types of liquid dispensing mechanisms and/or types of liquid.

FIG. 1 is a schematic diagram of a liquid supply system 100 in accordance with some embodiments. The fluid supply system 100 includes a container 110 containing a liquid, a tank 120, a dispensing mechanism 130 including a filter 140 and at least one pump 150, and a controller 160.

The container 110 contains the liquid to be dispensed by the dispensing mechanism 130. In at least one embodiment, the liquid is photoresist for use in a lithography process. Other types of liquid are within the scope of various embodiments. For example, a liquid having a quality, or a quality of a product processed by the liquid, likely affected by gas accompanying the liquid is usable in the fluid supply system 100 and is contained in the container 110. The container 110 includes a gas inlet 116 for receiving a pressurized gas from a pressurized gas supply. Examples of the pressurized gas include, but are not limited to, inert gases, such as nitrogen. The pressure of the pressurized gas is sufficient to move the liquid from the container 110 via a piping 114 to the tank 120. It is possible that an amount of the pressurized gas accompanies the liquid flowing from the container 110 to the tank 120. Alternatively or additionally, it is possible that accompanying gas is included in the liquid for other reasons. In accordance with some embodiments, the amount of accompanying gas in the liquid is to be eliminated, or at least reduced, before the liquid is dispensed by the dispensing mechanism 130.

The tank 120 has a liquid inlet 121, a liquid outlet 122, another liquid inlet 123, a gas release outlet 124, and a gas collection space 125. In the embodiment specifically disclosed in FIG. 1, the liquid inlet 121 and the gas release outlet 124 are arranged in an upper portion of the tank 120, whereas the liquid outlet 122 and the liquid inlet 123 are arranged in a lower portion of the tank 120. Other inlet/outlet arrangements for the tank 120 are within the scope of various embodiments. The liquid inlet 121 is coupled to the piping 114 to receive the liquid from the container 110. In at least one embodiment, the piping 114 extends into the tank 120 and has an opened end submerged below a surface 126 of the liquid 127 contained in the tank 120. A portion of the accompanying gas included in the liquid 127, e.g., in the form of bubbles, escapes the liquid 127 and is collected in the gas collection space 125. A gas release valve 128 and a sensor 129 are coupled to the gas release outlet 124 for venting the collected gas in the gas collection space 125 outside the tank 120 via the gas release outlet 124. The liquid outlet 122 is coupled to the dispensing mechanism 130 via a piping 131 to supply an amount of the liquid 127 in the tank 120 to the dispensing mechanism 130. Although a portion of the accompanying gas included in the liquid 127 is collected in the gas collection space 125, it is possible that another portion of the accompanying gas is still included in the liquid supplied via the piping 131 to the dispensing mechanism 130.

The dispensing mechanism 130 is configured to dispense the liquid received from the tank 120 to wafer processing equipment WPE. The wafer processing equipment WPE is configured to perform one or more processings on semiconductor wafers. Examples of processing performed by the wafer processing equipment WPE include, but are not limited to, lithography, film deposition, etching, stripping, cleaning, planarization, polishing. For example, in at least one embodiment where the liquid is photoresist, the wafer processing equipment WPE includes a nozzle for dispensing the photoresist onto a wafer. In the dispensing mechanism 130, the filter 140 and the at least one pump 150 are coupled by one or more pipings 132. The at least one pump 150 is configured to move the liquid from the tank 120, via the liquid outlet 122 and the pipings 131, 132 to the filter 140. The filter 140 filters the liquid to remove contaminants and/or bubbles from the liquid. Examples of material of the filter 140 include, but are not limited to, mesh, membrane or other porous media. In various embodiments, the filtering operation of the filter 140 is performed continuously or intermittently, automatically or based on user command, depending on the types of the dispensing mechanism 130 and/or other considerations. The at least one pump 150 is further configured to move the filtered liquid, via the one or more pipings 132, to the wafer processing equipment WPE. Every time the at least one pump 150 dispenses the liquid to the wafer processing equipment WPE, the dispensing mechanism 130 is considered to have performed one dispensing operation.

During the filtering operation of the filter 140, the accompanying gas included as bubbles in the liquid is separated from the filtered liquid. The filter 140 includes a gas collection space 142 for collecting the gas separated from the filtered liquid. To prevent the collected gas from re-entering the filtered liquid, the collected gas in the gas collection space 142 is vented to the outside of the filter 140. For this purpose, a vent valve 143 is coupled to the gas collection space 142 of the filter 140. When the vent valve 143 is closed, the gas separated from the filtered liquid is collected in the gas collection space 142. When the vent valve 143 is open in a venting operation, the collected gas in the gas collection space 142 is vented outside the filter 140. The vent valve 143 is controlled to be opened or closed under command of a controller of the at least one pump 150. In at least one embodiment, the vent valve 143 is coupled to the controller 160 and is controlled to be opened or closed under command of the controller 160. Other arrangements are within the scope of various embodiments. For example, at least one embodiment, the vent valve 143 is not coupled to a controller and has, or is associated with, a timer for opening the vent valve 143 at predetermined time intervals. In at least one embodiment, a pressure generated by the at least one pump 150 is used to push the collected gas out of the gas collection space 142 in the venting operation. It is possible that an amount of the liquid is also pushed out together with the collected gas in the venting operation.

To reduce a potential waste of the usable liquid, the gas collection space 142 of the filter 140 is coupled to the tank 120, via the vent valve 143, a piping 144 and the liquid inlet 123. The piping 144 has a first end coupled to the gas collection space 142, and a second end coupled to the liquid inlet 123. The vent valve 143 is coupled to the piping 144 between the first and second ends of the piping 144. The collected gas in the gas collection space 142 is vented, together with an amount of the liquid pushed out of the filter 140 in the venting operation, to the tank 120. The gas vented from the filter 140 to the tank 120 is collected in the gas collection space 125 and is vented outside the tank 120 as described herein. The amount of liquid pushed out of the filter 140 in the venting operation is added to the liquid 127 in the tank 120 and reused in subsequent dispensing operations. As a result, an excessive waste of the usable liquid due to the venting operation at the filter 140 is preventable in at least one embodiment.

In some embodiments, in addition to the venting operation of the collected gas from the filter 140 to the tank 120, another venting operation of the collected gas from the filter 140 to the outside of both the filter 140 and the tank 120 is performed. For example, after a predetermined number of dispensing operations performed by the dispensing mechanism 130 or after a predetermined time interval, a system flush is performed to vent the collected gas, together with an amount of the liquid, in the filter 140 to a drainage FAC. In at least one embodiment, the drainage FAC includes a waste collecting bin for collecting the liquid flushed out from the filter 140 together with the collected gas.

To vent the collected gas from the filter 140 to the drainage FAC, the fluid supply system 100 includes a piping 145 and a valve arrangement 170. The piping 145 has a first end coupled to an intermediate point 146 of the piping 144, and a second end coupled to the drainage FAC. The valve arrangement 170 is coupled to the piping 144 and the piping 145 between the filter 140 and the tank 120. The valve arrangement 170 includes a first valve 171 and a second valve 172. The first valve 171 is coupled to the piping 144 between the intermediate point 146 and the liquid inlet 123. The second valve 172 is coupled to the piping 145 between the intermediate point 146 and the drainage FAC.

The valve arrangement 170 has first position corresponding to the venting operation of the collected gas from the filter 140 to the tank 120 (hereinafter referred to as "vent-to-tank operation", and a second position corresponding to the venting operation of the collected gas from the filter 140 to the drainage FAC (hereinafter referred to as "vent-to-FAC operation"). In the first position corresponding to the vent-to-tank operation, the first valve 171 is open and the second valve 172 is closed. As a result, when the vent valve 143 is open, the collected gas in the gas collection space 142 is vented, via the piping 144 and the open first valve 171 and vent valve 143, to the liquid inlet 123 of the tank 120. In the second position corresponding to the vent-to-FAC operation, the first valve 171 is closed and the second valve 172 is open. As a result, when the vent valve 143 is open, the collected gas in the gas collection space 142 is vented, via the piping 144 and the open vent valve 143 and second valve 172, to the drainage FAC. The valve arrangement 170 is coupled to the controller 160 to be controlled by the controller 160 in conjunction with the vent valve 143. The described valve arrangement is an example, and other valve arrangements are within the scope of various embodiments. For example, in at least one embodiment, the valve arrangement 170 includes a three-way valve at the intermediate point 146 where the piping 144 and the piping 145 are coupled to each other. Such three-way valve is configured to operate similarly to the described combination of the first valve 171 and second valve 172.

The gas release valve 128 is coupled to the piping 145 at an intermediate point 147 between the intermediate point 146 and the drainage FAC. As a result, when the gas release valve 128 is open, the collected gas in the gas collection space 125 is vented to the drainage FAC via the piping 145. Other arrangements are within the scope of various embodiments. For example, in at least one embodiment, a separate piping, other than the piping 145, is coupled between the gas release valve 128 and the drainage FAC.

As described herein, the accompanying gas included in the liquid supplied from the container 110 to the tank 120 and the collected gas vented from the filter 140 to the tank 120 are collected in the gas collection space 125. The collected gas in the gas collection space 125 is vented to the outside of the tank 120, e.g., to the drainage FAC, via the gas release outlet 124. Specifically, when the gas release valve 128 is open, the collected gas in the gas collection space 125 is vented to the outside of the tank 120. The sensor 129 is coupled to the gas release outlet 124 to detect an amount of the collected gas in the gas collection space 125. When the detected amount of the collected gas reaches a predetermined level, the sensor 129 issues a gas release signal causing the gas release valve 128 to open. The gas release valve 128 and the sensor 129 are coupled to the controller 160. The controller 160, upon receipt of the gas release signal from the sensor 129, controls the gas release valve 128 to open. Other arrangements are within the scope of various embodiments. For example, in at least one embodiment, the sensor 129 directly sends the gas release signal to the gas release valve 128. In at least one embodiment, the sensor 129 is provided in the gas collection space 125. In at least one embodiment, the sensor 129 is omitted. When the sensor 129 is omitted, the gas release valve 128 is manually open by an operator and/or periodically open under command of the controller 160.

In at least one embodiment, the venting operation of the tank 120 to the drainage FAC, i.e., a vent-to-FAC operation, is performed in conjunction with a purging operation of the at least one pump 150. Specifically, the at least one pump 150 is configured to purge an unused portion of the liquid back to the tank 120, either via the piping 131 or via a separate piping. The unused portion of the liquid is an amount of the liquid that has been delivered to the dispensing mechanism 130 from the tank 120 but has not been dispensed to the wafer processing equipment WPE. In at least one embodiment, the controller 160 is coupled to dispensing mechanism 130 to control the purging operation or to obtain information about when the purging operation is to be performed. The controller 160 controls the gas release valve 128 to open during the purging operation. As a result, a pressure generated by the at least one pump 150 during the purging operation for purging the unused portion of the liquid to the tank 120 is also used to push the collected gas out of the tank 120 to the drainage FAC.

In the embodiment specifically disclosed in FIG. 1, the controller 160 is coupled to the gas release valve 128, sensor 129, dispensing mechanism 130, and valve arrangement 170. Other arrangements are within the scope of various embodiments. For example, one or more of the gas release valve 128, sensor 129, dispensing mechanism 130, and valve arrangement 170 is/are not coupled to the controller 160, and is/are manually and/or periodically operable as described herein. In at least one embodiment, the control 160 is a separate controller provided for controlling the gas release valve 128 and the valve arrangement 170. In one or more embodiments, the controller 160 is a controller for controlling the entire fluid supply system 100, including the vent valve 143 and the dispensing mechanism 130. In some embodiments, the controller 160 is a controller for both the fluid supply system 100 and the wafer processing equipment WPE. In some embodiments, the controller 160 comprises one or more processors programmed for performing one or more functionality described herein. In some embodiments, the controller 160 comprises specifically configured hardware (e.g., one or more application specific integrated circuits or ASIC(s)) in addition to or in lieu of one or more processors. The valves in the fluid supply system 100, e.g., one or more of the gas release valve 128, and valve arrangement 170, include controllable valves or manual valves. Examples of controllable valves include, but are not limited to, electric valves and pneumatic valves. Pneumatic valves are also referred to as "air valves." Examples of sensors usable as the sensor 129 include, but are not limited to, optical sensors, capacitive sensors and ultrasonic sensors.

Compared to other approaches, the fluid supply system 100 in accordance with some embodiments provides improved liquid quality and/or reduces excessive waste of usable liquid. For example, in other approaches where collected gas in a filter in a dispensing mechanism is vented directly to a drainage, with no option to vent the collected gas to a liquid tank, the frequency with which the collected gas in the filter is vented to the drainage is a consideration. If the filter is vented too often, an excessive amount of usable liquid is likely wasted, because every time the filter is vented, an amount of usable liquid is also pushed out to the drainage. In addition, as the frequency of the venting operation increases, the downtime associated with the venting operation also increases. On the other hand, if the filter is not sufficiently frequently vented, there is a likelihood that the collected gas in the filter will re-enter the filtered liquid in the form of bubbles which, in turn, will negatively affect the quality of the filtered liquid dispensed to the wafer processing equipment and/or the quality of the wafers being processed with such bubble-containing liquid. Given the discussed considerations, finding an appropriate frequency for performing the venting operation is a difficult task, especially in situations where the gas collection space of the filter is limited. Such a limited gas collection space of the filter often forces the manufacturer to vent the filter frequently to ensure product quality, at the expense of wasted liquid.

The fluid supply system 100 in accordance with some embodiments provides the option to vent the collected gas in the gas collection space 142 of the filter 140 to the tank 120, i.e., the vent-to-tank operation. As a result, an excessive waste of usable liquid observed in other approaches is avoidable, because the liquid vented together with the collected gas from the filter 140 to the tank 120 is reusable in subsequent dispensing operations. Because the concern associated with potential waste of usable liquid is lessened by the vent-to-tank operation, it is possible to focus the control of the frequency of the venting operation at the filter 140 on liquid and/or product quality. As a result, improved liquid and/or product quality is achievable without excessively wasting the liquid.

In some embodiments, the gas collection space 125 at the tank 120 is greater than the gas collection space 142 at the filter 140. As a result, it is possible to collect a greater amount of gas in the gas collection space 125 of the tank 120 than in the gas collection space 142 of the filter 140. Compared to other approaches where a vent to the drainage is frequently performed due to the limited gas collection space of the filter, a vent-to-FAC operation from the tank 120 to the drainage FAC in the fluid supply system 100 in accordance with some embodiments is performed less frequently due to the greater storage capability of the gas collection space 125 of the tank 120. This is another factor contributes to the reduction of wasted liquid in the fluid supply system 100. In one or more embodiments, the vent-to-FAC operation of the tank 120 is performed together with a purging operation of the at least one pump 150, which is a regular operation of the dispensing mechanism 130. As a result, there is zero or close-to-zero downtime associated with the vent-to-FAC operation of the tank 120.

Figure 2:
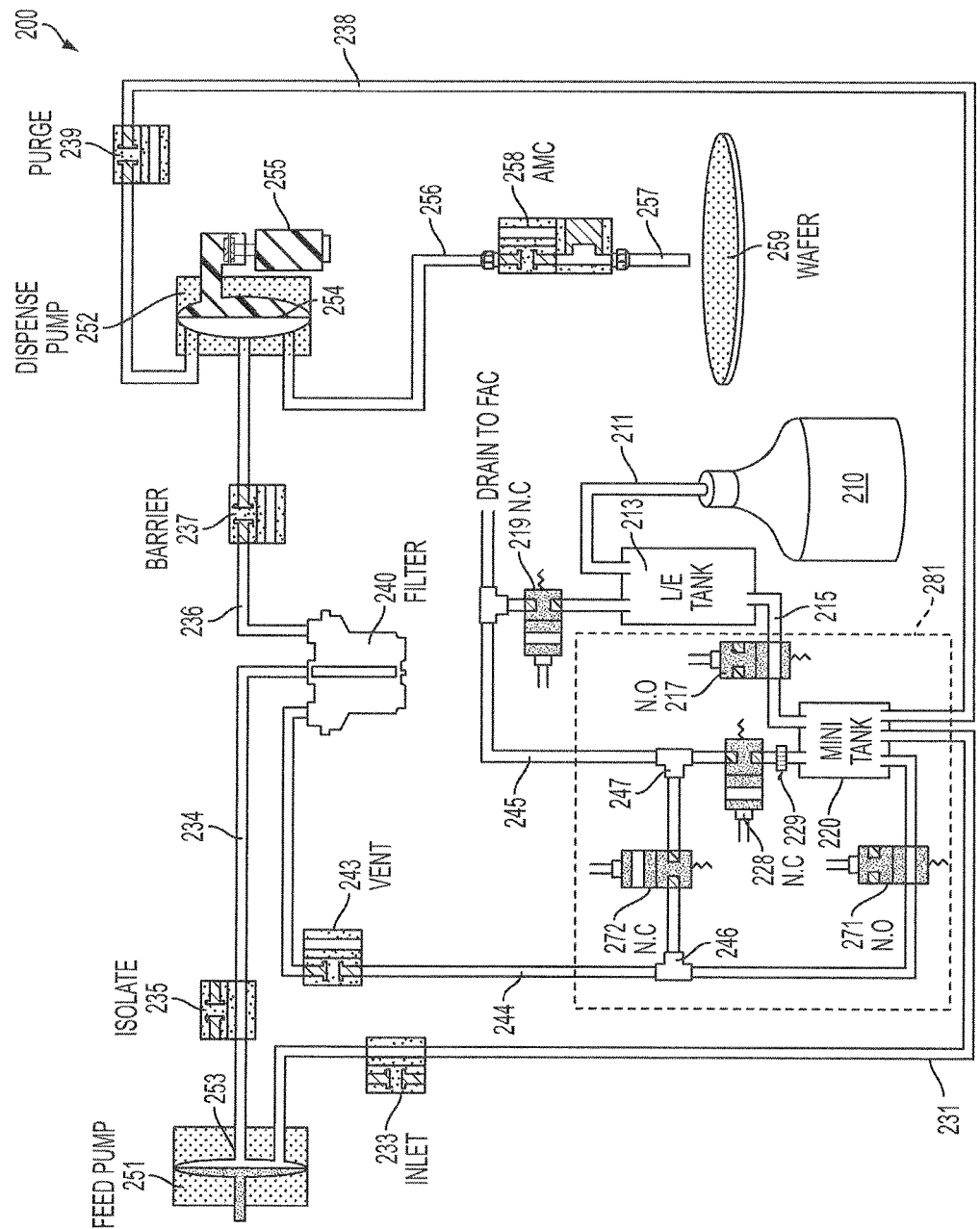
FIG. 2 is a schematic diagram of a liquid supply system in accordance with some embodiments.

FIG. 2 is a schematic diagram of a liquid supply system 200 in accordance with some embodiments. Elements in FIG. 2 having corresponding elements in FIG. 1 are designated by the reference numerals of FIG. 1 increased by one hundred. The liquid supply system 200 includes a container 210, an intermediate tank (also referred to as "LIE tank") 213, a tank (also referred to as "mini tank") 220, a filter 240, a feeding pump 251 and a dispense pump 252. In at least one embodiment, the feeding pump 251 and the dispense pump 252 correspond to the at least one pump 150 described with respect to FIG. 1, and a controller of the feeding pump 251 and dispense pump 252 controls valves 233, 235, 237, 239 and 243. The filter 240, the feeding pump 251 and the dispense pump 252 define a dispensing mechanism corresponding to the dispensing mechanism 130 described with respect to FIG. 1.

The container 210 contains a liquid to be dispensed. The container 210 is coupled by a piping 211 to the intermediate tank 213. The intermediate tank 213 is coupled by a piping 215 to the tank 220. A normally-open valve 217 is coupled to the piping 215 between the intermediate tank 213 and the tank 220. The intermediate tank 213 has a gas collection space for collecting accompanying gas in the liquid supplied from the container 210. A gas release valve 219 is coupled to the intermediate tank 213 for venting the collected gas in the gas collection space of the intermediate tank 213 to the outside of the intermediate tank 213. For example, the collected gas in the intermediate tank 213 is vented periodically or in response to a bubble sensor coupled to the intermediate tank 213. In at least one embodiment, the intermediate tank 213 is omitted.

The tank 220 has a gas release outlet to which a gas release valve 228 and a bubble sensor 229 are coupled. The tank 220 is coupled to the feeding pump 251 by a piping 231. An inlet valve 233 is coupled to the piping 231 between the tank 220 and the feeding pump 251. The feeding pump 251 has a moveable diaphragm (or piston) 253. The diaphragm 253 of the feeding pump 251 is driven by a motor (or pneumatically). The feeding pump 251 is coupled by a piping 234 to a liquid inlet of the filter 240. An isolate valve 235 is coupled to the piping 234 between the feeding pump 251 and the filter 240. A liquid outlet of the filter 240 is coupled by a piping 236 to the dispense pump 252. A barrier valve 237 is coupled to the piping 236 between the filter 240 and the dispense pump 252. The dispense pump 252 has a moveable diaphragm 254 which is driven by a motor 255. The dispense pump 252 is coupled via a piping 256 to a nozzle 257. An AMC valve 258 is coupled to the piping 256 between the dispense pump 252 and the nozzle 257. In at least one embodiment, the nozzle 257 corresponds to the wafer processing equipment WPE described with respect to FIG. 1 for dispensing the liquid onto a wafer 259. The dispense pump 252 is further coupled by a piping 238 back to the tank 220. A purge valve 239 is coupled to the piping 238 between the dispense pump 252 and the tank 220.

The filter 240 has a gas collection space coupled via a piping 244 to the tank 220. A vent valve 243 is coupled to the piping 244 between the gas collection space of the filter 240 and the tank 220. The piping 244 has an intermediate point 246 to which a piping 245 is coupled. The piping 245 is coupled to the drainage FAC and has an intermediate point 247. A normally-open valve 271 is coupled to the piping 244 between the intermediate point 246 and the tank 220. A normally-closed valve 272 is coupled to the piping 245 between the intermediate point 246 and the intermediate point 247. The gas release valve 228 of the tank 220 is a normally-closed valve and coupled between the tank 220 and the intermediate point 247. The gas release valve 219 of the intermediate tank 213 is a normally-closed valve and is coupled to the piping 245. The normally-open valve 217, normally-closed valve 228, normally-open valve 271 and normally-closed valve 272 are controllable valves. The normally-open valve 217, normally-closed valve 228, normally-open valve 271 and normally-closed valve 272 define together with the tank 220 an arrangement 281 that permits one or more vent-to-tank operations and/or vent-to-FAC operations to be automatically controlled by a controller in accordance with some embodiments.

Figure 3:
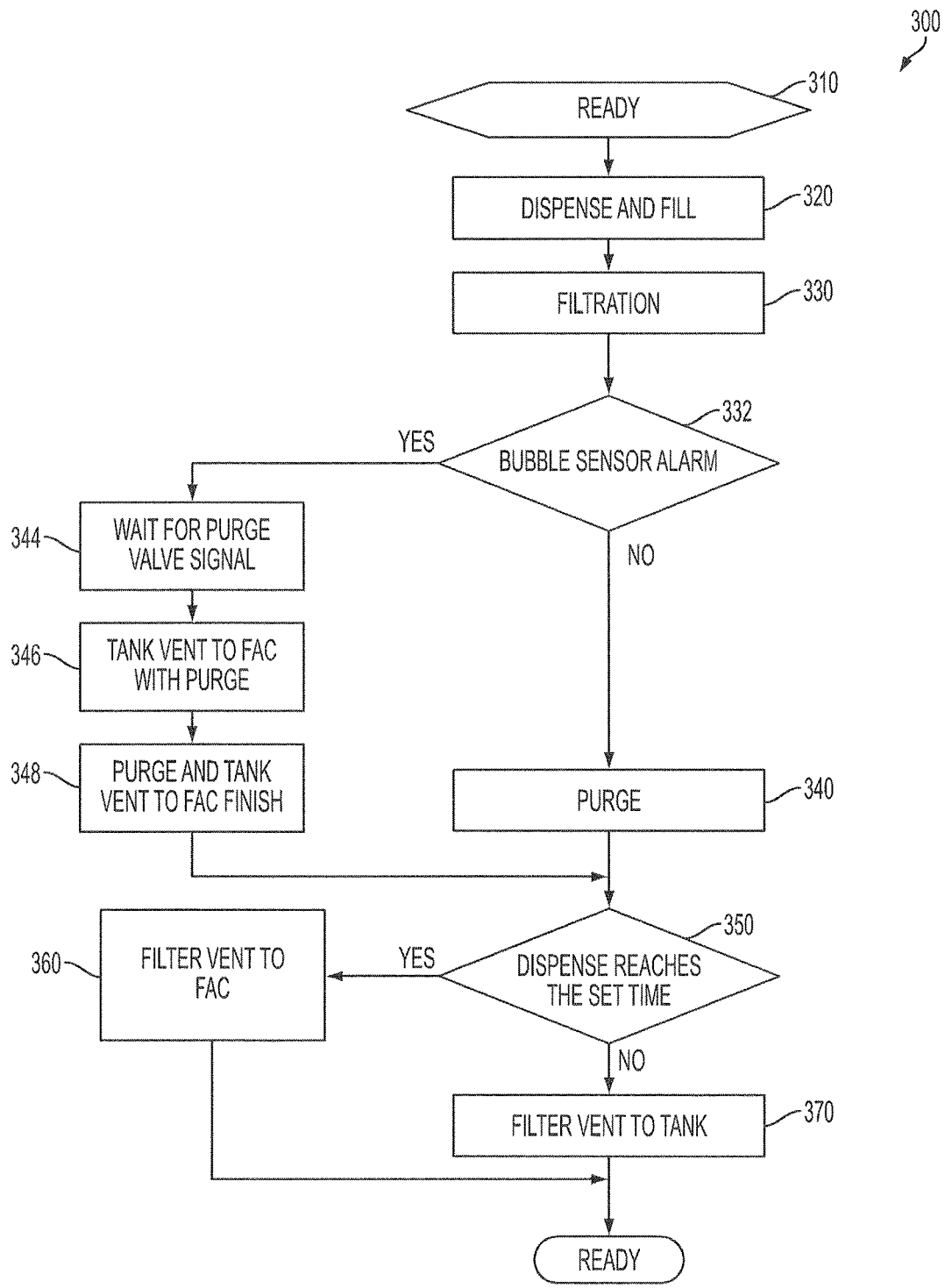
FIG. 3 is a flow chart of a liquid supply method in accordance with some embodiments.

FIG. 3 is a flow chart of a liquid supply method 300 in accordance with some embodiments. In at least one embodiment, the method 300 is performed in the liquid supply system 200 described with respect to FIG. 2. FIGS. 4A-4G are schematic diagrams of the liquid supply system 200 at various operations in the method 300. One or more components of the liquid supply system 200 is/are controlled by a controller to perform the method 300. An example controller is the controller 160 described with respect to FIG. 1.

Figure 4A:
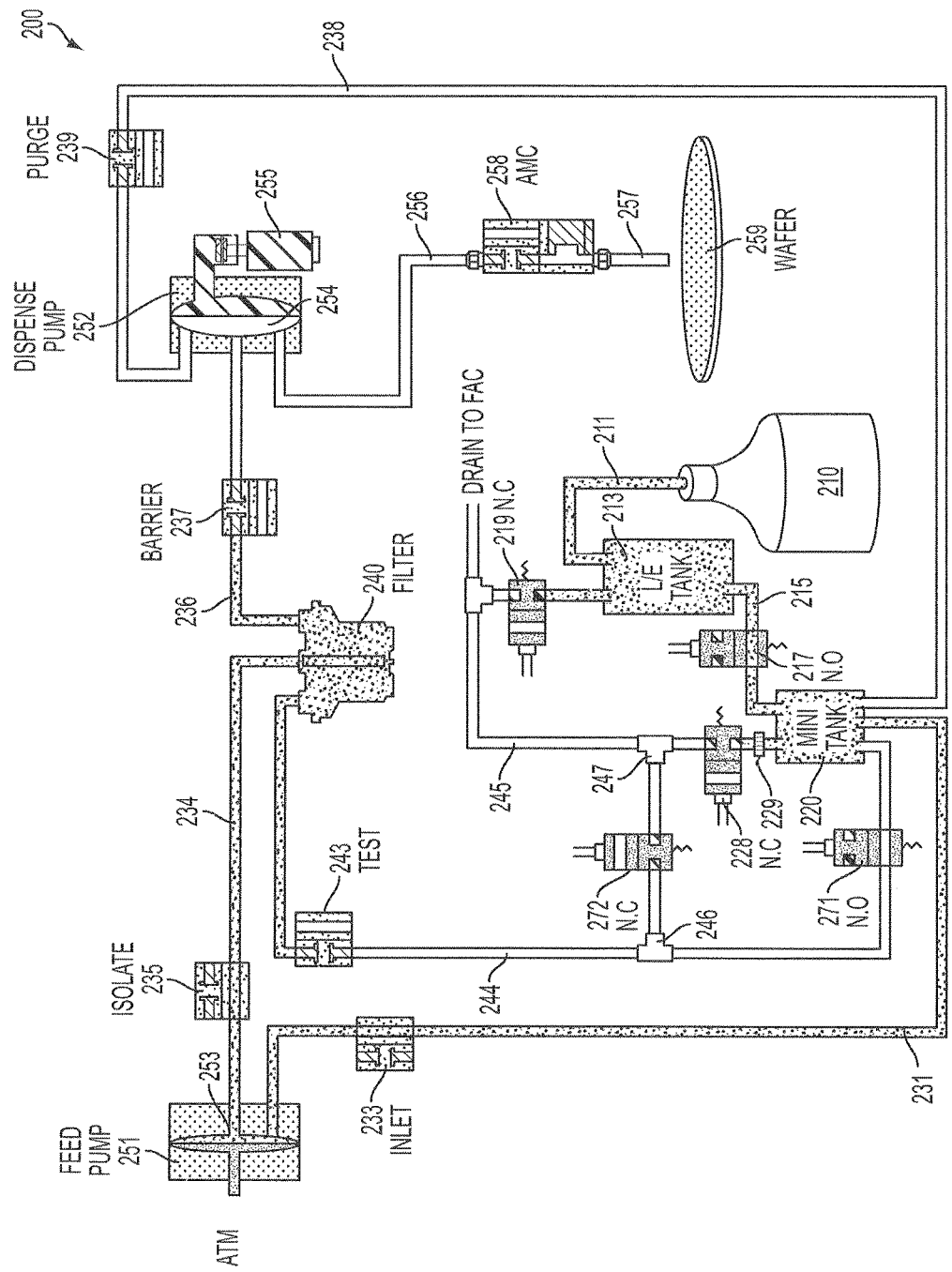
FIGS. 4A-4G are schematic diagrams of a liquid supply system at various operations in the method of FIG. 3.

At operation 310 of the method 300, the liquid supply system 200 is at a ready state shown in FIG. 4A. The inlet valve 233 and the isolate valve 235 are opened. The vent valve 243 and the barrier valve 237 are closed, and prevent the liquid from flowing from the filter 240 via the piping 244 to the tank 220, and via the piping 236 to the dispense pump 252. An amount of filtered liquid is in the dispense pump 252 ready to be dispensed. A gas collection space exists in each of the intermediate tank 213, the tank 220, and the filter 240 at the top portion of the corresponding tank or filter. The gas collection spaces are not illustrated in FIGS. 4A-4G for simplicity.

Figure 4B:
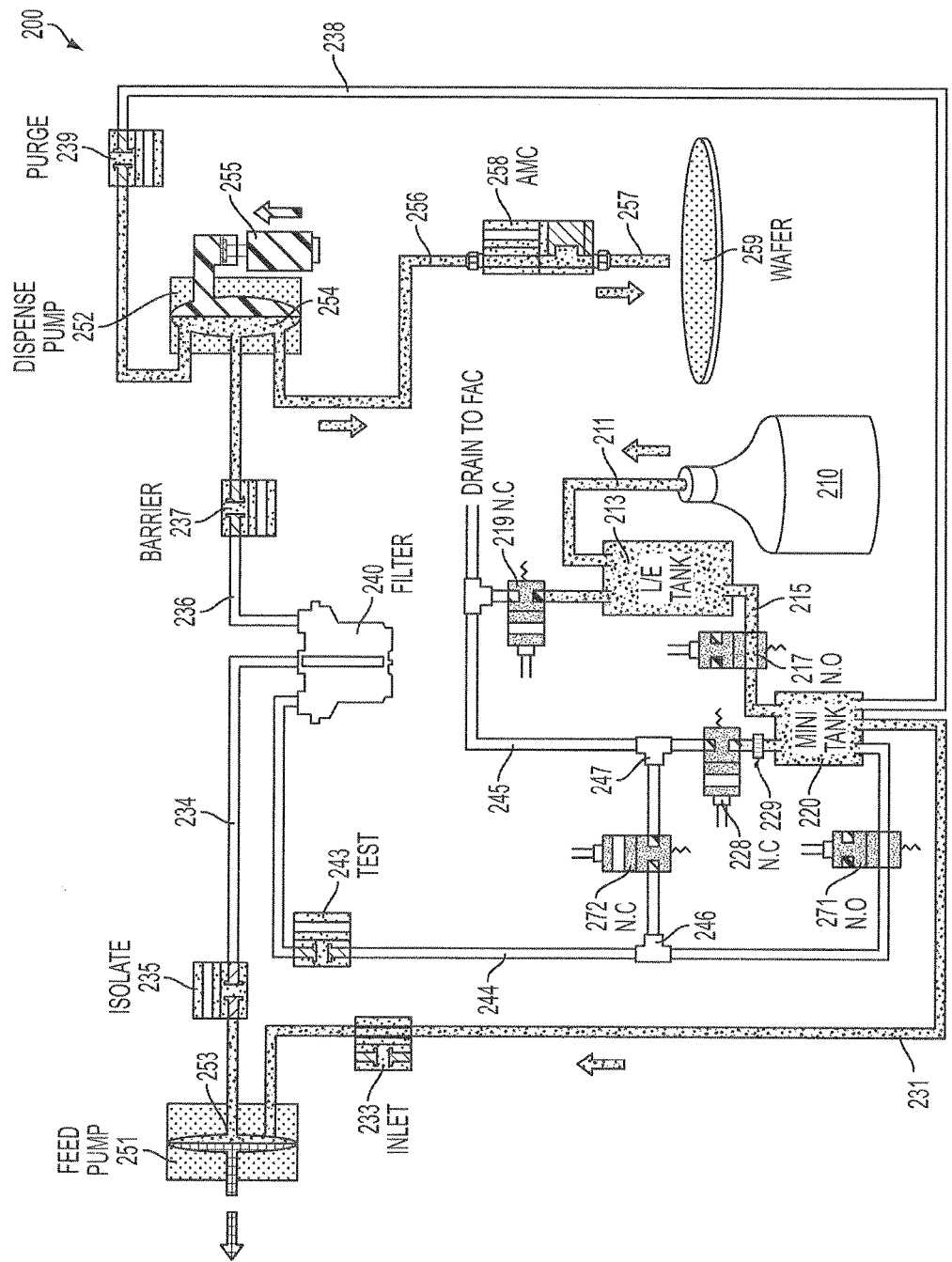

At dispense-and-fill operation 320 of the method 300, the liquid supply system 200 is at a state shown in FIG. 4B. On the side of the feeding pump 251, the inlet valve 233 is open, the isolate valve 235 is closed, and the diaphragm 253 of the feeding pump 251 is driven, to the left as shown in FIG. 4B, to suck the liquid from the tank 220 to the feeding pump 251, thereby filling the feeding pump 251. On the side of the dispense pump 252, the barrier valve 237 is closed, the purge valve 239 is closed and the AMC valve 258 is opened. The diaphragm 254 of the dispense pump 252 is driven, to the left as shown in FIG. 4B, to push the filtered liquid in the dispense pump 252 to the nozzle 257 via the opened AMC valve 258 to dispense the filtered liquid on the wafer 259.

Figure 4C:
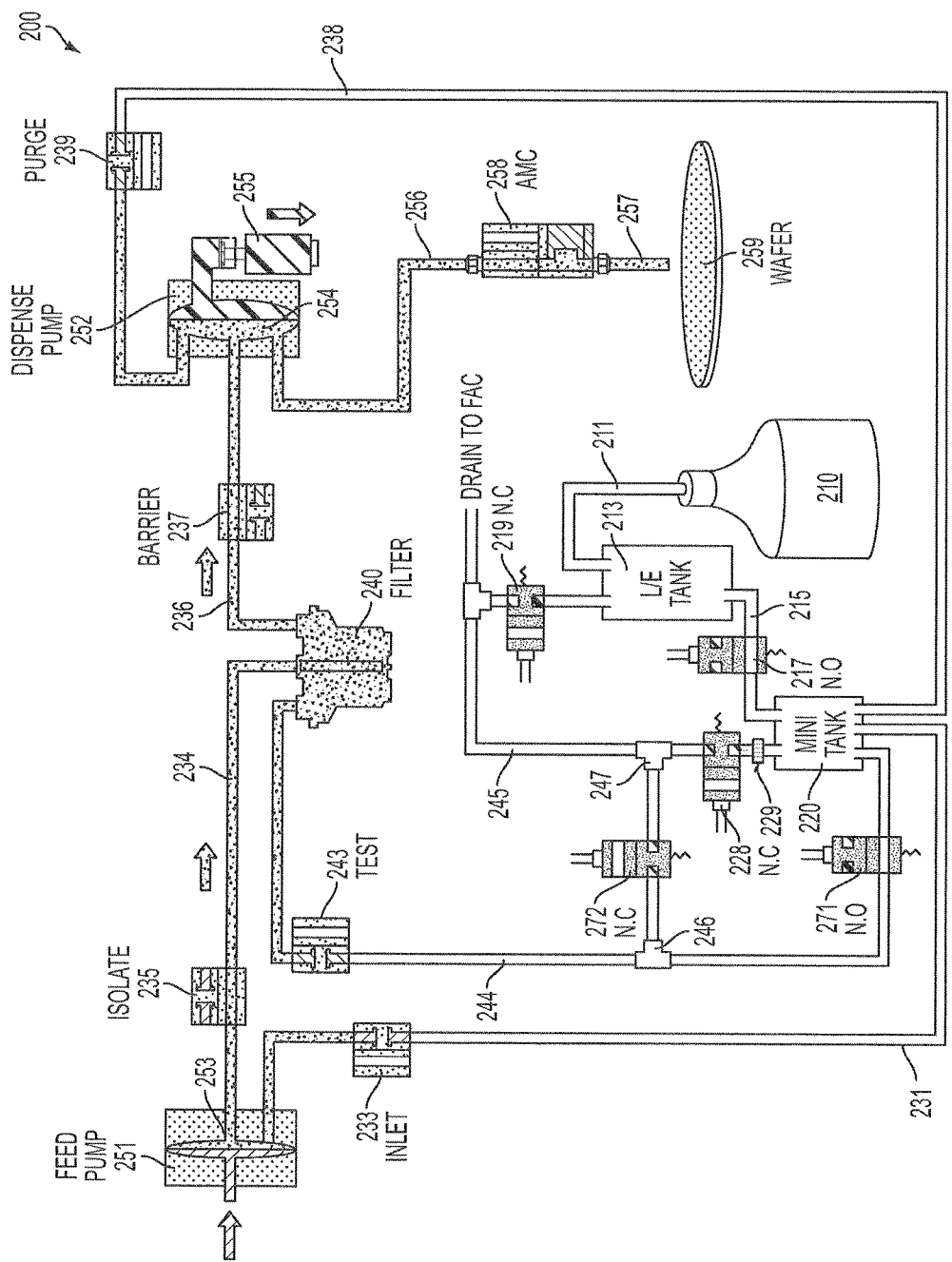

At filtration operation 330 of the method 300, the liquid supply system 200 is at a state shown in FIG. 4C. The inlet valve 233 is closed, the isolate valve 235 is opened, the vent valve 243 is closed, and the barrier valve 237 is opened. The diaphragm 253 of the feeding pump 251 is driven, to the right as shown in FIG. 4C, to push the liquid in the feeding pump 251 into the filter 240. The diaphragm 254 of the dispense pump 252 is driven, to the right as shown in FIG. 4C, to suck the filtered liquid from the filter 240 to the dispense pump 252. The purge valve 239 and AMC valve 258 are closed. In at least one embodiment, the liquid supply system 200 returns to the ready state described with respect to FIG. 4A, ready for a subsequent dispensing operation.

At operation 332 of the method 300, it is determined, by the controller, whether the bubble sensor 229 issues an alarm or gas release signal indicating that the amount of collected gas in the tank 220 has reached a predetermined level. If it is determined that there is no gas release signal from the bubble sensor 229, operation 340 is performed. If it is determined that there is a gas release signal from the bubble sensor 229, a tank-vent-to-FAC operation including operations 344, 346 and 348 is performed.

Figure 4D:
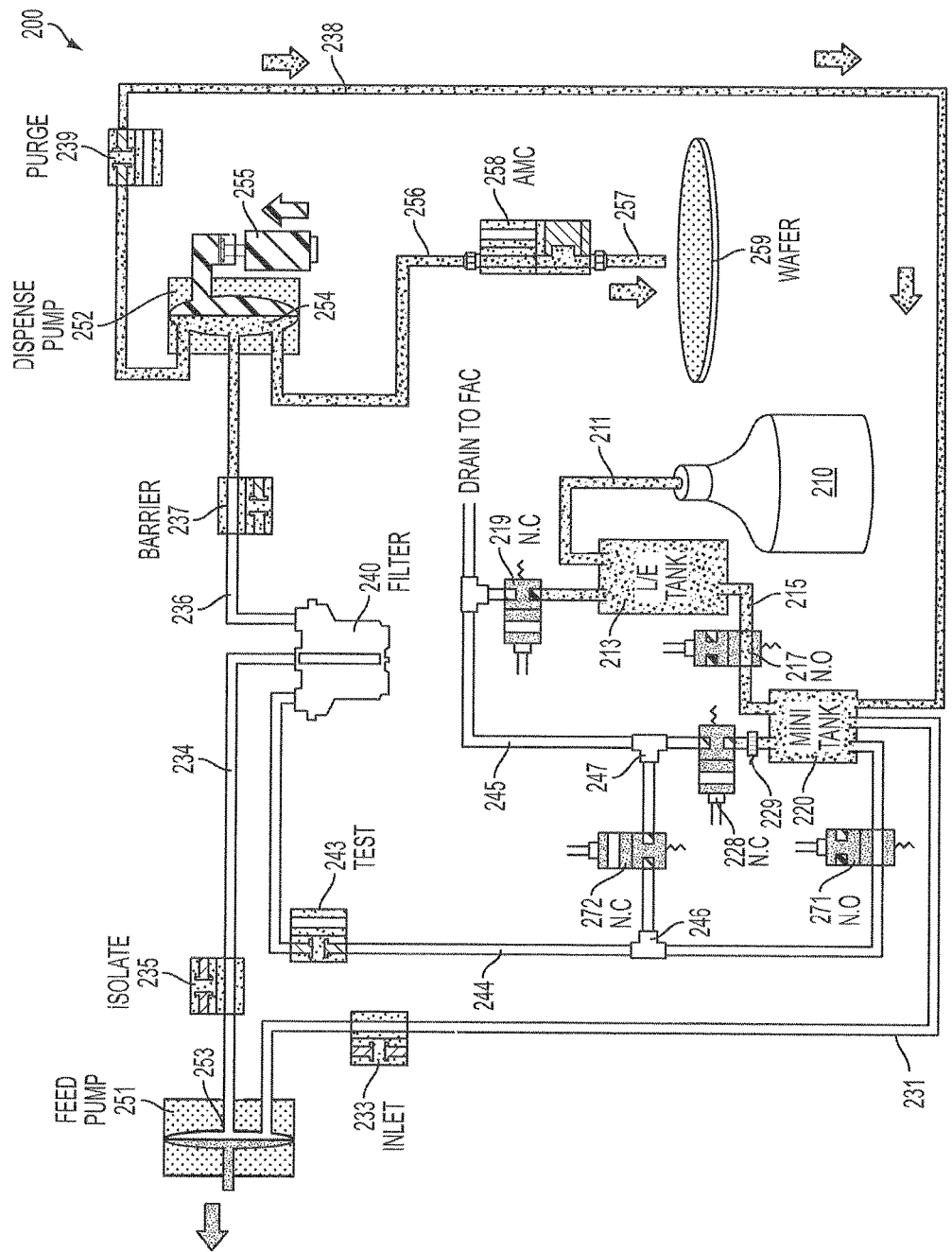

At purging operation 340 of the method 300, the liquid supply system 200 is at a state shown in FIG. 4D. The AMC valve 258 is closed and the purge valve 239 is opened. As the diaphragm 254 of the dispense pump 252 is driven to the left as shown in FIG. 4D, an amount of the filtered liquid in the dispense pump 252, which has not been dispensed in a dispensing operation, is purged via the piping 238 to the tank 220. In at least one embodiment, the liquid supply system 200 returns to the ready state of FIG. 4A after the purging operation 340.

Figure 4E:
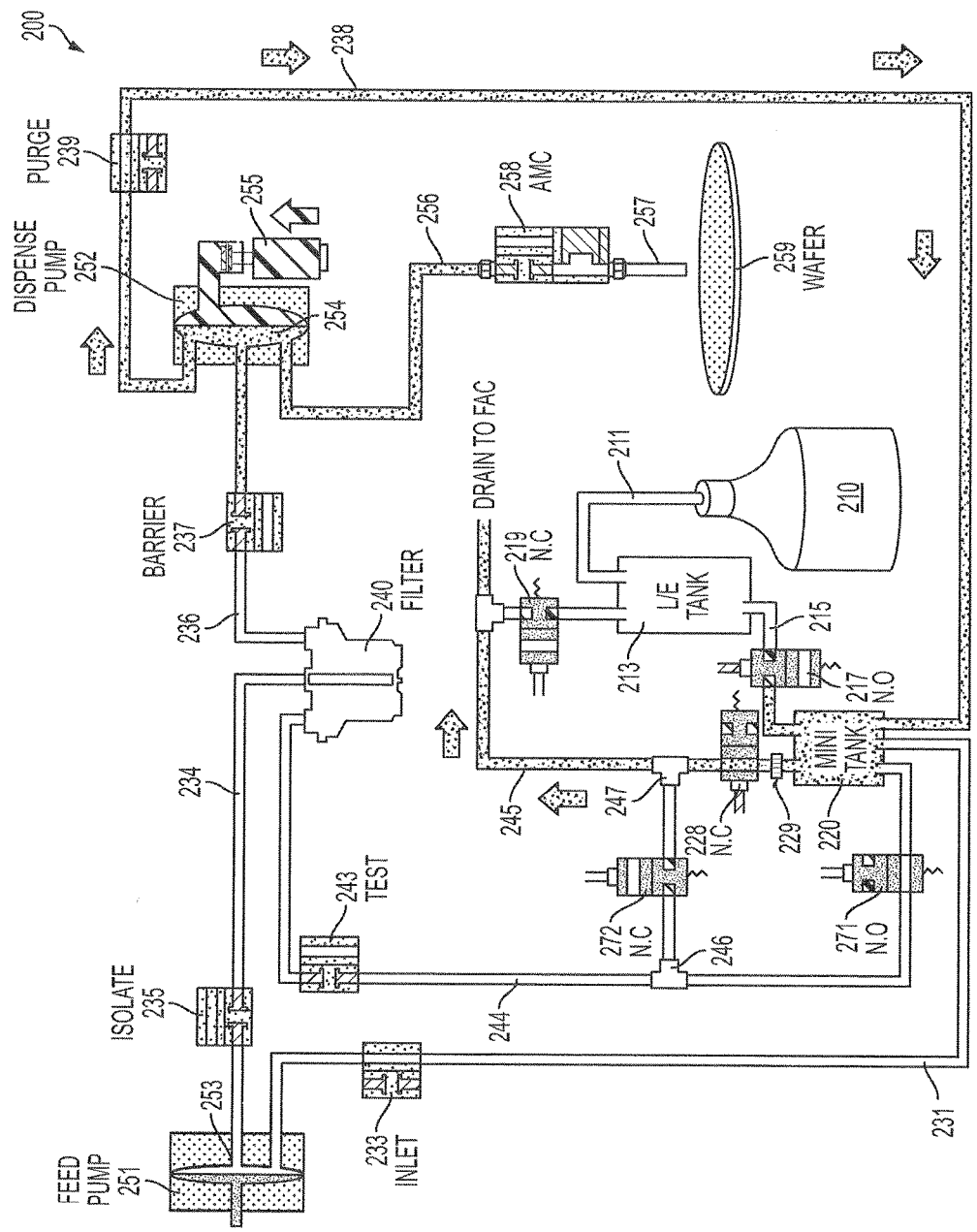

At the tank-vent-to-FAC operation including operations 344, 346 and 348 of the method 300, the liquid supply system 200 is at a state shown in FIG. 4E. The tank-vent-to-FAC operation is performed together with a purging operation of the dispense pump 252. At operation 344, the controller wait for a purge valve signal that causes the purge valve 239 to open. At operation 346, when the purge valve signal is issued and the purge valve 239 is opened, the controller opens the gas release valve 228, which is a normally-closed valve, and closes the normally-open valve 217. As a result, the pressure generated by the dispense pump 252 in the purging operation for purging the unused filtered liquid from the dispense pump 252 to the tank 220 is also used to push the collected gas in the tank 220 via the opened gas release valve 228 and the piping 245 to the drainage FAC. The closed valve 217 prevents the pressure of the purging operation from moving the liquid from the tank 220 back to the intermediate tank 213. At operation 348 corresponding to the end of the purging operation when the purge valve 239 is closed, the controller returns the normally-open valve 217 to the opened state, and the gas release valve 228, which is a normally-closed valve, to the closed state.

At operation 350 of the method 300 after the purging operation 340 or the tank-vent-to-FAC operation, it is determined, by the controller, whether a predetermined number of dispensing operations has been performed and/or a predetermined time period has passed since the last time the filter 240 was flushed. If the determination returns a positive result, a filter-vent-to-FAC operation 360 is performed. If the determination returns a negative result, a filter-vent-to-tank operation 370 is performed. Alternatively, it is possible to initiate the filter-vent-to-FAC operation 360 by user command, for example, for trouble-shooting.

Figure 4F:
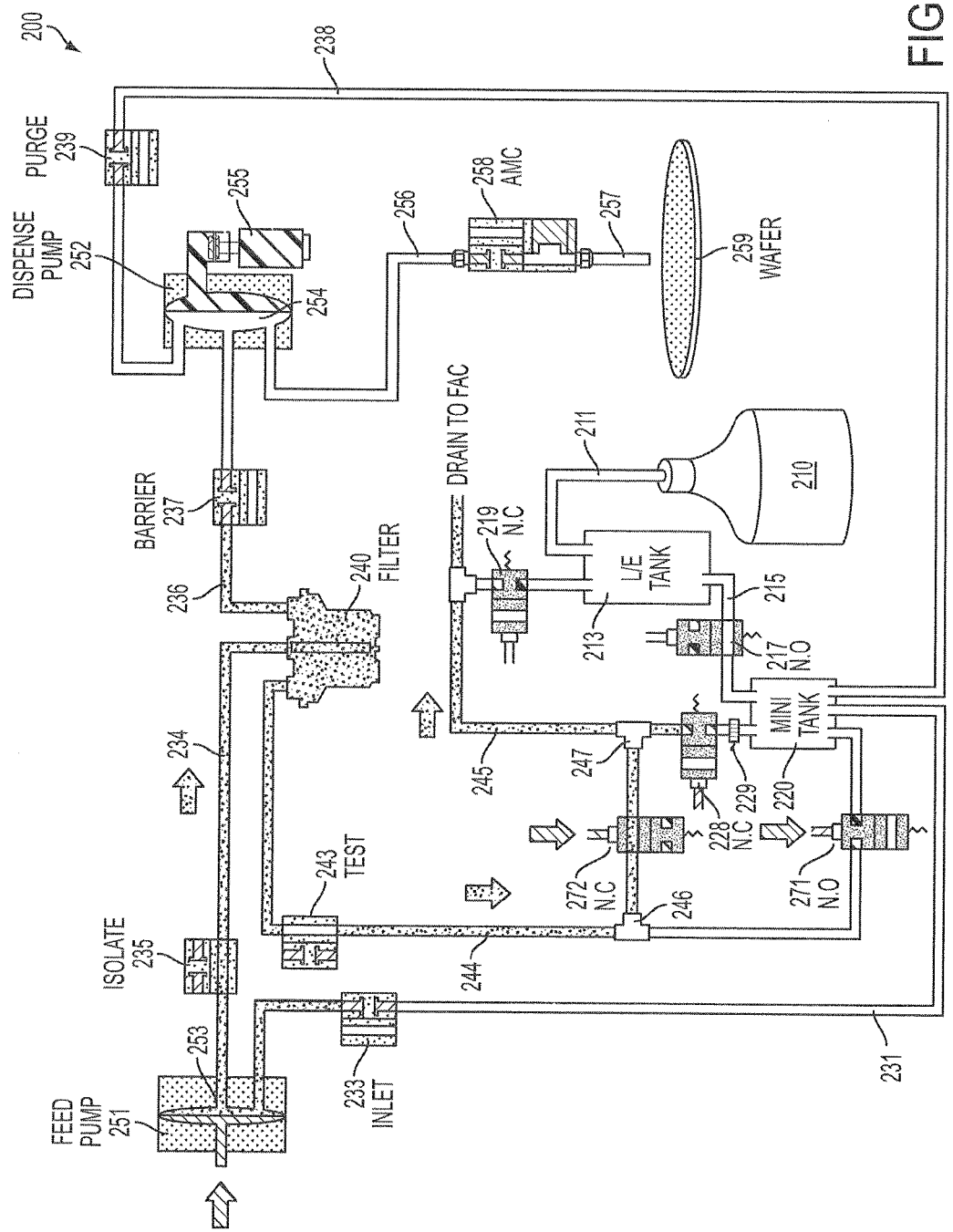

At the filter-vent-to-FAC operation 360 of the method 300, the liquid supply system 200 is at a state shown in FIG. 4F. The inlet valve 233 and the barrier valve 237 are closed, whereas the isolate valve 235 and the vent valve 243 are opened. The normally-closed valve 272 is opened and the normally-open valve 271 is closed. The diaphragm 253 is driven, to the right as shown in FIG. 4F, to push the liquid in the feeding pump 251 into the filter 240 and then out of the filter 240 together with the collected gas in the filter 240. The collected gas and the liquid are pushed from the filter 240 via the opened vent valve 243, the piping 244, the opened valve 272, the piping 245 to the drainage FAC. At the end of the filter-vent-to-FAC operation 360, the normally-open valve 271 returns to the opened state, the normally-closed valve 272 returns to the closed state, and the vent valve 243 is closed. The liquid supply system 200 then returns to the ready state described with respect to FIG. 4A.

Figure 4G:
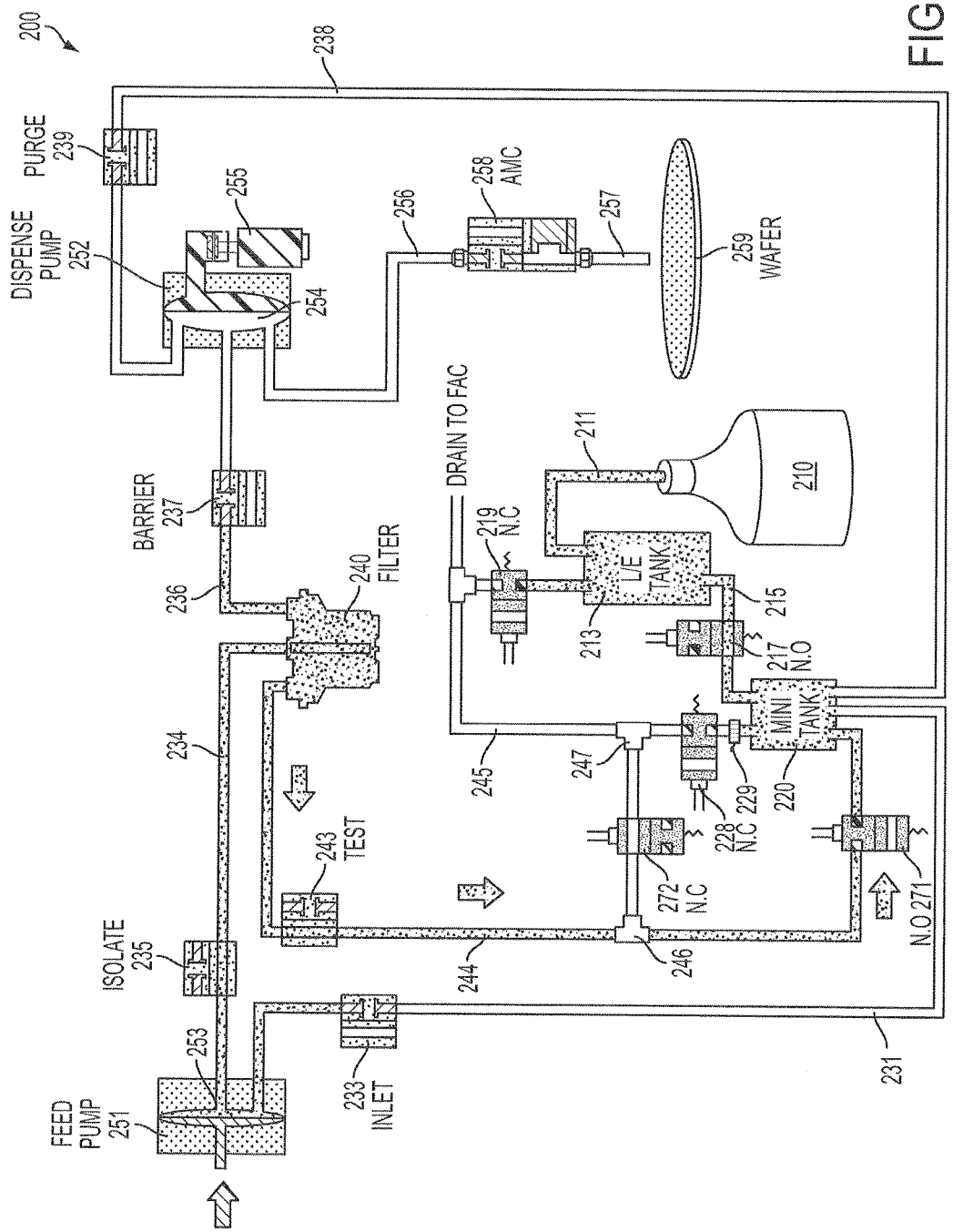

At the filter-vent-to-tank operation 370 of the method 300, the liquid supply system 200 is at a state shown in FIG. 4G. The inlet valve 233 and the barrier valve 237 are closed, whereas the isolate valve 235 and the vent valve 243 are opened. The normally-closed valve 272 is closed and the normally-open valve 271 is opened. The diaphragm 253 is driven, to the right as shown in FIG. 4F, to push the liquid in the feeding pump 251 into the filter 240 and then out of the filter 240 together with the collected gas in the filter 240. The collected gas and the liquid are pushed from the filter 240 via the opened vent valve 243, the piping 244, the opened valve 271 to the tank 220. At the end of the filter-vent-to-tank operation 370, the vent valve 243 is closed and the inlet valve 233 is opened. The liquid supply system 200 then returns to the ready state described with respect to FIG. 4A.

In at least one embodiment, the filter-vent-to-tank operation 370 is performed after every dispensing operation (unless a filter-vent-to-FAC operation 360 is initiated). However, in some embodiments, the filter-vent-to-tank operation 370 is not performed after every dispensing operation. For example, if the determination at operation 350 returns a negative result, an additional determination is made to check whether a predetermined number of dispensing operations has been performed and/or a predetermined time period has passed since the last time the filter 240 was vented to the tank 220. If the additional determination returns a position result, the filter-vent-to-tank operation 370 is performed; otherwise, the liquid supply system 200 returns to the ready state described with respect to FIG. 4A. The number of dispensing operations and/or the time interval between successive filter-vent-to-tank operations 370 is/are smaller than the number of dispensing operations and/or the time interval between successive filter-vent-to-FAC operations 360. In at least one embodiment, the number of dispensing operations is counted by the number of times the AMC valve 258 is opened. The order of operations described with respect to the method 300 is an example. Other arrangements are within the scope of various embodiments. For example, in some embodiments, the operations 350, 360 and 370 are performed before the operations 332, 340, 344, 346 and 348. One or more effects discussed with respect to the fluid supply system 100 is/are achievable by the liquid supply system 200 and/or in the method 300 in accordance with some embodiments.

Figure 5:
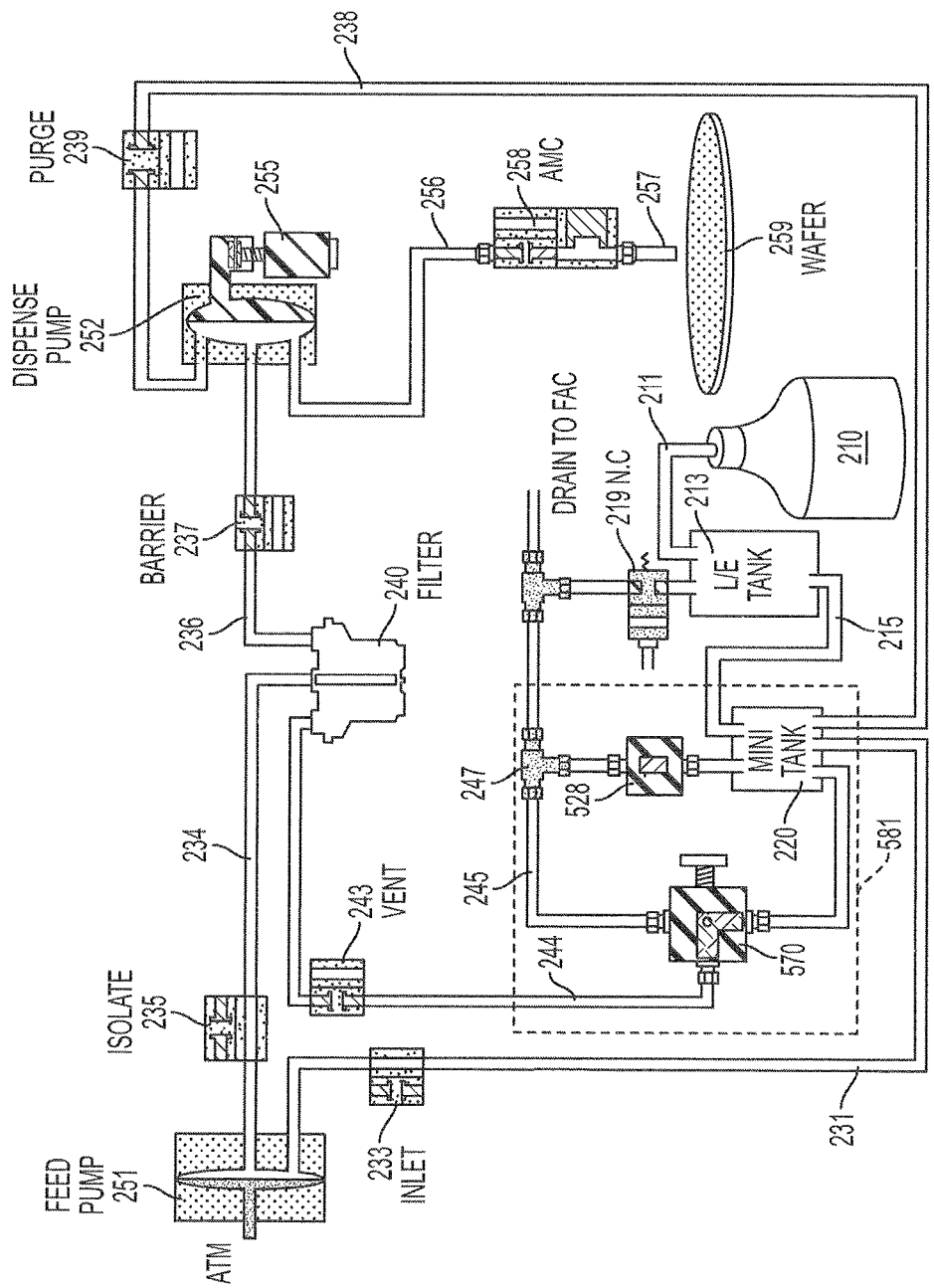
FIG. 5 is a schematic diagram of a liquid supply system in accordance with some embodiments.

FIG. 5 is a schematic diagram of a liquid supply system 500 in accordance with some embodiments. The liquid supply system 500 is similar to the liquid supply system 200, except for an arrangement 581 which replaces the arrangement 281 in FIG. 2. Specifically, the arrangement 581 includes a three-way valve 570 and a gas release valve 528. The gas release valve 528 is coupled between the gas release outlet of the tank 220 and the intermediate point 247 of the piping 245.

The three-way valve 570 is coupled to the intersection of the piping 244 and the piping 245. The three-way valve 570 normally assumes a first position in which the three-way valve 570 couples the vent valve 243 to the tank 220 for performing filter-vent-to-tank operations. When a filter-vent-to-FAC operation is to be performed, the three-way valve 570 is switched to a second position in which the three-way valve 570 couples the vent valve 243 to the piping 245 and the drainage FAC. In at least one embodiment, the three-way valve 570 is a manual valve that is to be switched by a human operator between the first and second positions. In some embodiments, the three-way valve 570 is a controllable valve.

The gas release valve 528 is a manual valve. In some embodiments, the gas release valve 528 has, or is associated with, an indicator that indicates the amount of collected gas in the tank 220. A human operator checks the indicator of the gas release valve 528 and determines whether to perform a tank-vent-to-FAC operation to vent the collected gas from the tank 220 to the drainage FAC. In at least one embodiment, if a tank-vent-to-FAC operation is to be performed, the operator manipulates the controller to add the pressurized gas to the container 210 to push the liquid level in the tank 220. The operator further manually opens the gas release valve 528. The raised level of the liquid in the tank 220 and/or the pressure of the collected gas vent the collected gas out of the tank 220 to the drainage FAC. The operator then closes the gas release valve 528. In other aspects, the operation of the liquid supply system 500 is similar to the operation of the liquid supply system 200 as described with respect to FIGS. 3 and 4A-4G.

Figure 6:
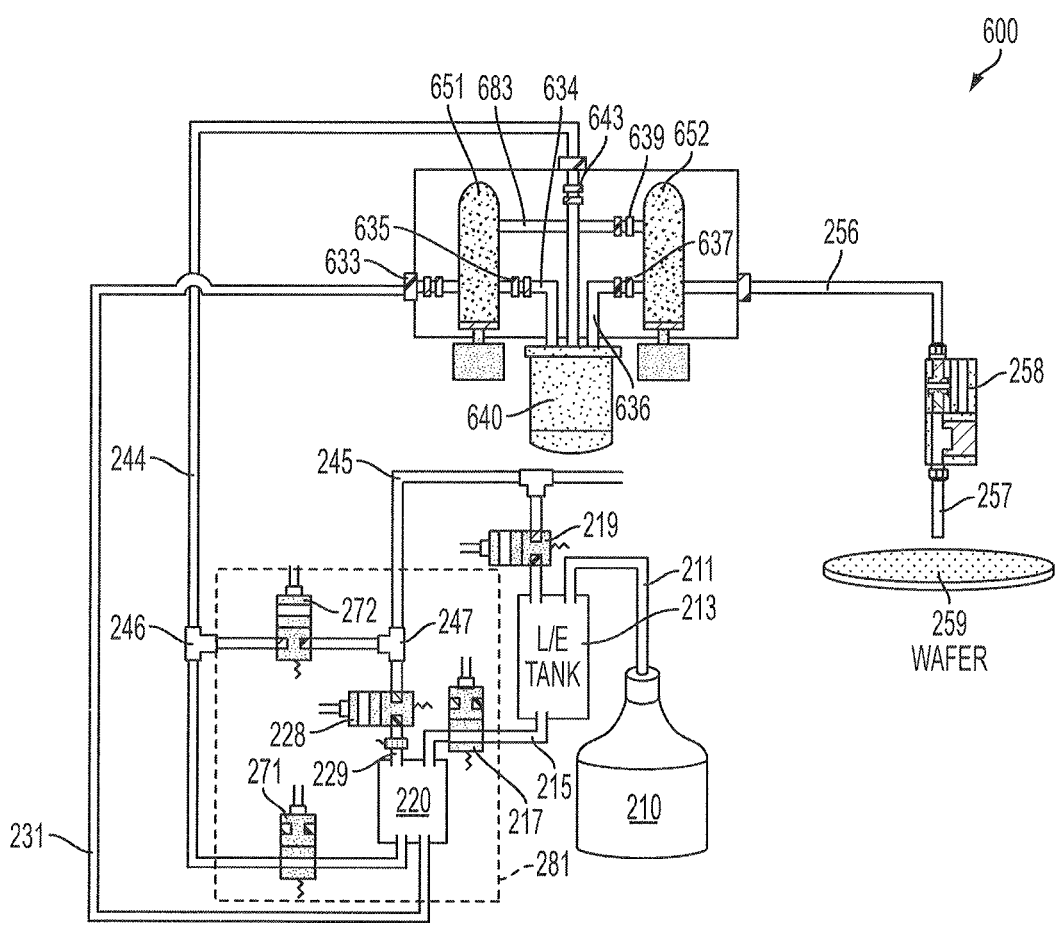
FIG. 6 is a schematic diagram of a liquid supply system in accordance with some embodiments.

FIG. 6 is a schematic diagram of a liquid supply system 600 in accordance with some embodiments. The liquid supply system 600 is similar to the liquid supply system 200, except for the configuration of the dispensing mechanism. Elements of the dispensing mechanism in FIG. 6 with corresponding elements in the dispensing mechanism of FIG. 2 are designated by the reference numerals of FIG. 2 increased by four hundreds. The dispensing mechanism in the liquid supply system 600 includes a feeding pump 651, a dispense pump 652 and a filter 640. The feeding pump 651 is coupled by a piping 634 to a liquid inlet of the filter 640. A liquid outlet of the filter 640 is coupled by a piping 636 to the dispense pump 652. A piping 683 couples the feeding pump 651 and the dispense pump 652, bypassing the filter 640. A purge valve 639 is coupled to the piping 683 between the feeding pump 651 and dispense pump 652. The filter 640 has a gas collection space coupled via a piping 244 to the tank 620. A vent valve 643 is coupled to the piping 244 between the gas collection space of the filter 640 and the tank 620. Valves 633, 635, 637 are arranged among various components of the liquid supply system 600 in a manner similar to valves 233, 235, 237 in the liquid supply system 200. In at least one embodiment, the arrangement 281 in the liquid supply system 600 is replaced with the arrangement 581 described with respect to FIG. 5.

Figure 7:
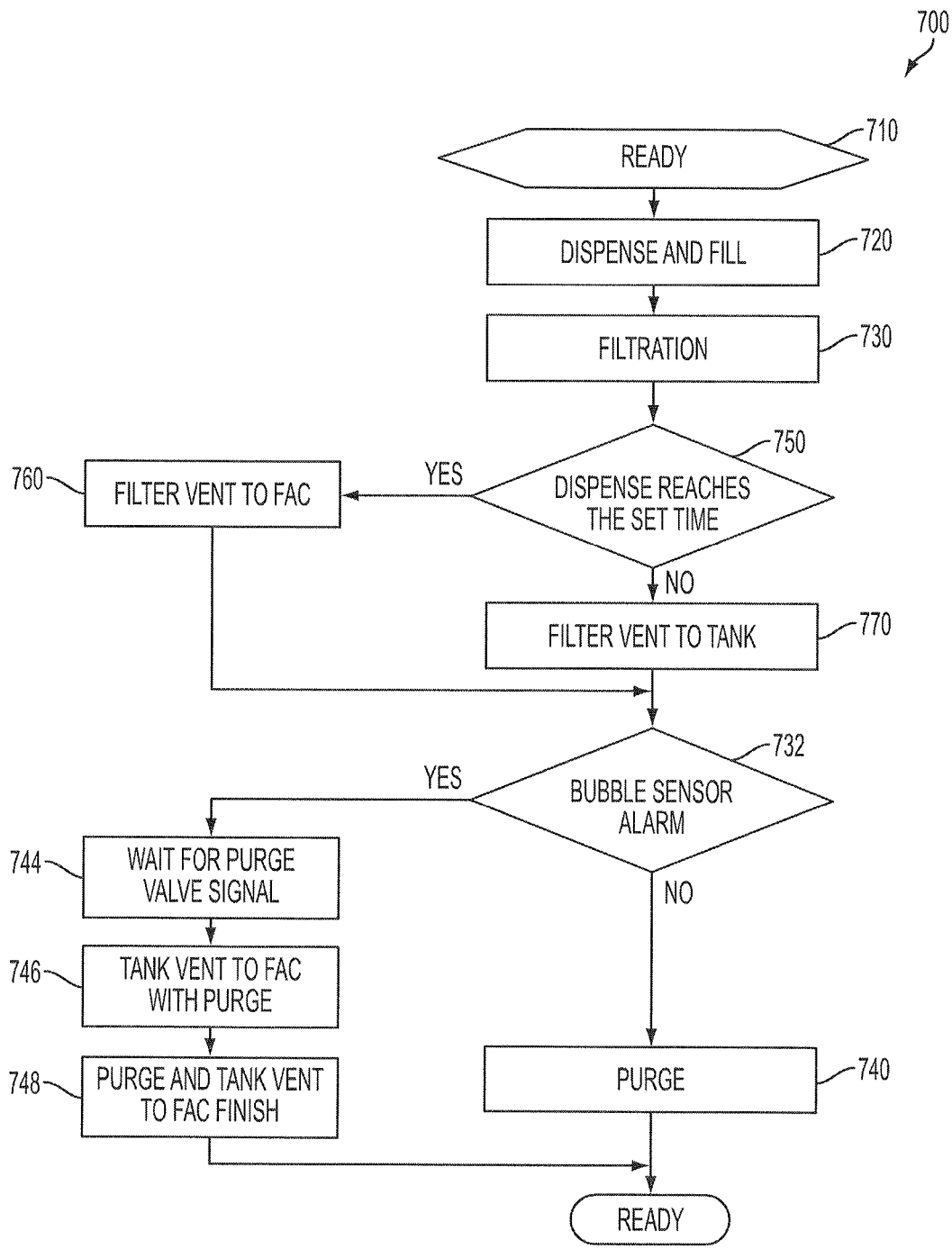
FIG. 7 is a flow chart of a liquid supply method in accordance with some embodiments.

FIG. 7 is a flow chart of a liquid supply method 700 in accordance with some embodiments. In at least one embodiment, the method 700 is performed in the liquid supply system 600 described with respect to FIG. 6. One or more components of the liquid supply system 600 is/are controlled by a controller to perform the method 700. An example controller is the controller 160 described with respect to FIG. 1. The operation of the liquid supply system 600 in the method 700 in accordance with some embodiments is similar to the operation of the liquid supply system 200 in the method 300 described with respect to FIG. 3. Elements of FIG. 7 with corresponding elements in FIG. 3 are designated by the reference numerals of FIG. 3 increased by four hundreds.

At operation 710, the liquid supply system 600 is at a ready state. An amount of the filtered liquid is in the dispense pump 652, ready to be dispensed.

At a dispense-and-fill operation 720, the feeding pump 651, dispense pump 652 and filter 640 are isolated from each other. The feeding pump 651 sucks the liquid from the tank 220 via the piping 231 to the feeding pump 651, thereby filling the feeding pump 651. The dispense pump 652 pushes the filtered liquid in the dispense pump 652 to the nozzle 257 via the opened AMC valve 258 to dispense the filtered liquid on the wafer 259.

At a filtration operation 730, the feeding pump 651 pushes the liquid in the feeding pump 651 via the piping 634 into the filter 640, and the dispense pump 652 sucks the filtered liquid from the filter 640 via the piping 636 to the dispense pump 652. In at least one embodiment, the liquid supply system 600 returns to the ready state described with respect to operation 710, ready for a subsequent dispensing operation.

At operation 750, it is determined, by the controller, whether a predetermined number of dispensing operations has been performed and/or a predetermined time period has passed since the last time the filter 640 was flushed. If the determination returns a positive result, a filter-vent-to-FAC operation 760 is performed. If the determination returns a negative result, a filter-vent-to-tank operation 770 is performed. Alternatively, it is possible to initiate the filter-vent-to-FAC operation 760 by user command, for example, for trouble-shooting.

At the filter-vent-to-FAC operation 760, the vent valve 643 is opened. The normally-closed valve 272 is opened and the normally-open valve 271 is closed. The feeding pump 651 pushes the liquid in the feeding pump 651, via the piping 634, into the filter 640 and then out of the filter 640 together with the collected gas in the filter 640. The collected gas and the liquid are pushed from the filter 640 via the opened vent valve 643, the piping 244, the opened valve 272, the piping 245 to the drainage FAC. At the end of the filter-vent-to-FAC operation 760, the normally-open valve 271 returns to the opened state, the normally-closed valve 272 returns to the closed state, and the vent valve 643 is closed.

The filter-vent-to-tank operation 770 is similar to the filter-vent-to-FAC operation 760, except that the normally-closed valve 272 is closed and the normally-open valve 271 is opened. The feeding pump 651 pushes the liquid in the feeding pump 651 into the filter 640 and then out of the filter 640 together with the collected gas in the filter 640. The collected gas and the liquid are pushed from the filter 640 via the opened vent valve 643, the piping 244, the opened valve 271 to the tank 220. At the end of the filter-vent-to-tank operation 770, the vent valve 643 is closed.

At operation 732 after the filter-vent-to-tank operation 770 or the filter-vent-to-FAC operation 760, it is determined, by the controller, whether the bubble sensor 229 issues an alarm or gas release signal indicating that the amount of collected gas in the tank 220 has reached a predetermined level. If it is determined that there is no gas release signal from the bubble sensor 229, a purging operation 740 is performed. If it is determined that there is a gas release signal from the bubble sensor 229, a tank-vent-to-FAC operation including operations 744, 746 and 748 is performed.

At the purging operation 740, the feeding pump 651 and the dispense pump 652 are isolated from the filter 640 by the isolate valve 635 and the barrier valve 637. The purge valve 639 is opened to couple the feeding pump 651 to the dispense pump 652. The dispense pump 652 pushes the unused liquid in the dispense pump 652 via the piping 683 to the feeding pump 651, bypassing the filter 640. The feeding pump 651 further pushes the unused liquid via the piping 231 to the tank 220. The liquid supply system 600 then returns to the ready state.

The tank-vent-to-FAC operation including operations 744, 746 and 748, is performed together with a purging operation. At operation 744, the controller wait for a purge valve signal for opening the purge valve 639. At operation 746, when the purge valve signal is issued, the controller opens the gas release valve 228, which is a normally-closed valve, and closes the normally-open valve 217. As a result, the pressure generated by the dispense pump 652 in the purging operation for purging the unused filtered liquid from the dispense pump 652 to the tank 220 is also used to push the collected gas in the tank 220 via the opened gas release valve 228 and the piping 245 to the drainage FAC. At operation 748 corresponding to the end of the purging operation, the controller returns the normally-open valve 217 to the opened state, and the gas release valve 228, which is a normally-closed valve, to the closed state. The liquid supply system 600 then returns to the ready state.

In at least one embodiment, the filter-vent-to-tank operation 770 is performed after every dispensing operation (unless a filter-vent-to-FAC operation 760 is initiated). However, in some embodiments, the filter-vent-to-tank operation 770 is not performed after every dispensing operation. For example, if the determination at operation 750 returns a negative result, an additional determination is made to check whether a predetermined number of dispensing operations has been performed and/or a predetermined time period has passed since the last time the filter 640 was vented to the tank 220. If the additional determination returns a position result, the filter-vent-to-tank operation 770 is performed; otherwise, operation 732 is performed. The number of dispensing operations and/or the time interval between successive filter-vent-to-tank operations 770 is/are smaller than the number of dispensing operations and/or the time interval between successive filter-vent-to-FAC operations 760. One or more effects discussed with respect to the fluid supply system 100 is/are achievable by the liquid supply system 200 and/or in the method 700 in accordance with some embodiments.

Figure 8:
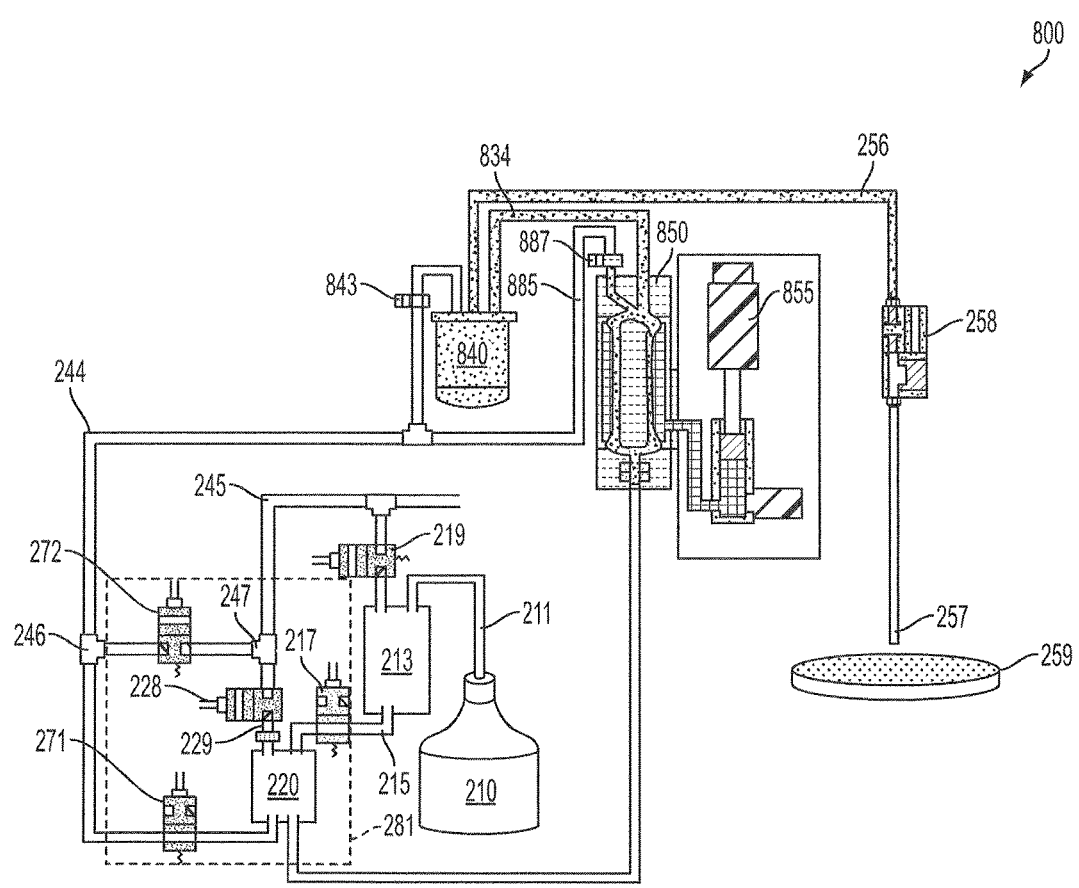
FIG. 8 is a schematic diagram of a liquid supply system in accordance with some embodiments.

FIG. 8 is a schematic diagram of a liquid supply system 800 in accordance with some embodiments. The liquid supply system 800 is similar to the liquid supply system 200, except for the configuration of the dispensing mechanism. Elements of the dispensing mechanism in FIG. 8 with corresponding elements in the dispensing mechanism of FIG. 2 are designated by the reference numerals of FIG. 2 increased by six hundreds. The dispensing mechanism in the liquid supply system 800 includes a filter 840 and a single pump 850, which functions as both a feeding pump and a dispensing pump. The pump 850 is coupled by a piping 834 to a liquid inlet of the filter 840. A liquid outlet of the filter 840 is coupled by a piping 256 to the nozzle 257 via the AMC valve 258. The filter 840 has a gas collection space coupled via a piping 244 to the tank 220. A vent valve 843 is coupled to the piping 244 between the gas collection space of the filter 840 and the tank 220. The pump 850 is driven by a motor 855. The pump 850 is coupled by a piping 885 to the piping 244. A pump vent valve 887 is coupled to the piping 885 between the pump 850 and the piping 244. In at least one embodiment, the arrangement 281 in the liquid supply system 800 is replaced with the arrangement 581 described with respect to FIG. 5.

Figure 9:
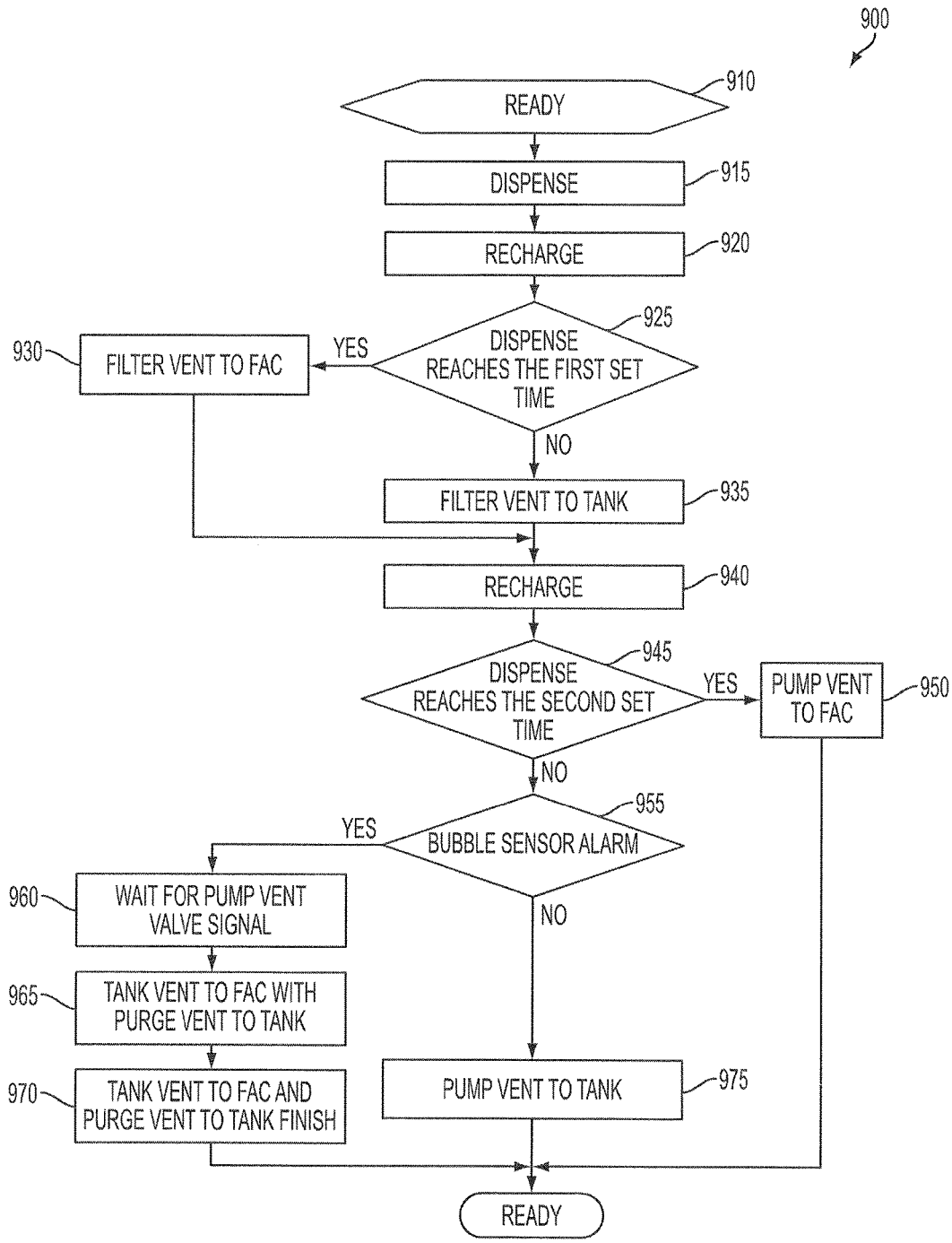
FIG. 9 is a flow chart of a liquid supply method in accordance with some embodiments.

FIG. 9 is a flow chart of a liquid supply method 900 in accordance with some embodiments. In at least one embodiment, the method 900 is performed in the liquid supply system 800 described with respect to FIG. 8. One or more components of the liquid supply system 800 is/are controlled by a controller to perform the method 900. An example controller is the controller 160 described with respect to FIG. 1.

At operation 910, the liquid supply system 800 is at a ready state. An amount of the liquid is in the pump 850, ready to be dispensed.

At a dispensing operation 915, the AMC valve 258 is opened. The pump 850 pushes the liquid in the pump 850 via the piping 834, through the filter 840, then via the piping 256 and the opened AMC valve 258 to the nozzle 257. The liquid pushed by the pump 850 through the filter 840 is filtered in this dispensing operation.

At a recharge operation 920, the pump 850 sucks the liquid from the tank 220 via the piping 231 to the pump 850, thereby filling the pump 850. In at least one embodiment, the liquid supply system 800 returns to the ready state described with respect to operation 910, ready for a subsequent dispensing operation.

At operation 925, it is determined, by the controller, whether a first predetermined number of dispensing operations has been performed and/or a first predetermined time period has passed since the last time the filter 840 was flushed. If the determination returns a positive result, a filter-vent-to-FAC operation 930 is performed. If the determination returns a negative result, a filter-vent-to-tank operation 935 is performed. Alternatively, it is possible to initiate the filter-vent-to-FAC operation 930 by user command, for example, for trouble-shooting.

At the filter-vent-to-FAC operation 930, the vent valve 843 is opened. The normally-closed valve 272 is opened and the normally-open valve 271 is closed. The pump 850 pushes the liquid in the pump 850, via the piping 834, into the filter 840 and then out of the filter 840 together with the collected gas in the filter 840. The collected gas and the liquid are pushed from the filter 840 via the opened vent valve 843, the piping 244, the opened valve 272, the piping 245 to the drainage FAC. At the end of the filter-vent-to-FAC operation 930, the normally-open valve 271 returns to the opened state, the normally-closed valve 272 returns to the closed state, and the vent valve 843 is closed.

The filter-vent-to-tank operation 935 is similar to the filter-vent-to-FAC operation 930, except that the normally-closed valve 272 is closed and the normally-open valve 271 is opened. The pump 850 pushes the liquid in the pump 850 into the filter 840 and then out of the filter 840 together with the collected gas in the filter 840. The collected gas and the liquid are pushed from the filter 840 via the opened vent valve 843, the piping 244, the opened valve 271 to the tank 220. At the end of the filter-vent-to-tank operation 935, the vent valve 843 is closed.

At another recharge operation 940 after the filter-vent-to-tank operation 935 or the filter-vent-to-FAC operation 930, the pump 850 sucks the liquid from the tank 220 via the piping 231 to the pump 850, thereby filling the pump 850.

At operation 945, it is determined, by the controller, whether a second predetermined number of dispensing operations has been performed and/or a second predetermined time period has passed since the last time the pump 850 was flushed. If the determination returns a positive result, a pump-vent-to-FAC operation 950 is performed. If the determination returns a negative result, operation 955 is performed. The first predetermined number of dispensing operations and/or the first time interval between successive filter-vent-to-FAC operations 930 is the same or different from the second predetermined number of dispensing operations and/or the second time interval between successive pump-vent-to-FAC operation 950, depending on various considerations.

At the pump-vent-to-FAC operation 950, the pump vent valve 887 is opened. The normally-closed valve 272 is opened and the normally-open valve 271 is closed. The pump 850 pushes the liquid in the pump 850, via the piping 885 with the opened pump vent valve 887, the piping 244, the opened valve 272, the piping 245 to the drainage FAC. At the end of the filter-vent-to-FAC operation 930, the normally-open valve 271 returns to the opened state, the normally-closed valve 272 returns to the closed state, and the pump vent valve 887 is closed. The liquid supply system 800 then returns to the ready state.

At the operation 955, it is determined, by the controller, whether the bubble sensor 229 issues an alarm or gas release signal indicating that the amount of collected gas in the tank 220 has reached a predetermined level. If it is determined that there is no gas release signal from the bubble sensor 229, a pump-vent-to-tank operation 975 is performed. If it is determined that there is a gas release signal from the bubble sensor 229, a tank-vent-to-FAC operation including operations 960, 965 and 970 is performed.

At the pump-vent-to-tank operation 975, the pump vent valve 887 is opened, the normally-closed valve 272 remains closed and the normally-open valve 271 remains opened. The pump 850 pushes the liquid in the pump 850 via the piping 885 with the opened pump vent valve 887, the piping 244, the opened valve 271 to the tank 220. At the end of the pump-vent-to-tank operation 975, the pump vent valve 887 is closed. The liquid supply system 800 then returns to the ready state.

The tank-vent-to-FAC operation including operations 960, 965 and 970, is performed together with a pump-vent-to-tank operation. At operation 960, the controller wait for a pump vent valve signal that opens the pump vent valve 887. At operation 965, when the pump vent valve signal is issued, the controller opens the gas release valve 228, which is a normally-closed valve, and closes the normally-open valve 217. As a result, the pressure generated by the pump 850 in the pump-vent-to-tank operation for purging the liquid or gas from the pump 850 to the tank 220 is also used to push the collected gas in the tank 220 via the opened gas release valve 228 and the piping 245 to the drainage FAC. At operation 970 corresponding to the end of the pump-vent-to-tank operation, the controller returns the normally-open valve 217 to the opened state, and the gas release valve 228, which is a normally-closed valve, to the closed state. The liquid supply system 800 then returns to the ready state.

One or more modifications discussed with respect to the method 300 and/or the method 700 is/are also applicable to the method 900. One or more effects discussed with respect to the fluid supply system 100 is/are achievable by the liquid supply system 800 and/or in the method 900 in accordance with some embodiments.

The above method(s) include(s) example operations, but the operations are not necessarily performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a liquid supply system comprises a container containing a liquid, a tank coupled to the container to receive the liquid from the container, and a dispensing mechanism coupled to the tank to receive the liquid to be dispensed. The dispensing mechanism comprises a filter configured to filter the liquid before dispensing. The filter comprises a first gas collection space configured to collect gas accompanying the liquid. The tank is controllably coupled to the first gas collection space of the filter to vent the collected gas from the filter to the tank.

According to some embodiments, a liquid supply system comprises a tank, a first piping, a second piping, a gas release valve and a valve arrangement. The tank comprises a first inlet in a lower portion of the tank, an outlet in the lower portion of the tank, a second inlet in an upper portion of the tank, and a gas release outlet in the upper portion of the tank. The first piping has opposite first and second ends, and a first intermediate point between the first and second ends of the first piping. The second end of the first piping is coupled to the first inlet of the tank. The second piping has opposite first and second ends, and a second intermediate point between the first and second ends of the second piping. The first end of the second piping is coupled to the first intermediate point of the first piping. The gas release valve is coupled between the gas release outlet and the second intermediate point of the second piping. The valve arrangement is coupled to the first piping and the second piping. The valve arrangement has a first position in which the valve arrangement couples the first end of the first piping to the first inlet of the tank, and a second position in which the valve arrangement couples the first end of the first piping to the second end of the second piping.

In a method of supplying a liquid, the liquid is moved from a tank to a filter. The filter filters the liquid received from the tank and the filtered liquid is dispensed. Gas from bubbles contained in the liquid is collected in a gas collection space of the filter. The collected gas is vented from the filter to the tank.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A liquid supply system, comprising:
a container containing a liquid;
a tank coupled to the container to receive the liquid from the container;
a dispensing mechanism coupled to the tank to receive the liquid to be dispensed, the dispensing mechanism comprising a filter configured to filter the liquid before dispensing, a feeding pump configured to receive the liquid from the tank at a first port and move the liquid from the tank to the filter, a dispensing pump configured to move filtered liquid out of the filter to be dispensed, and a first piping coupled between the feeding pump and the dispensing pump and bypassing the filter, the first piping coupled to a second port of the feeding pump different from the first port, the filter comprising a first gas collection space configured to collect gas accompanying the liquid, wherein a portion of the filtered liquid in the dispensing pump is returned to the tank through the first port and the second port;
a drainage line;
a first valve between the tank and the drainage line;
a second valve between the filter and the tank;

a third valve between the second valve and the tank; and
a fourth valve between the second valve and the drainage line,
wherein the tank is controllably coupled to the first gas collection space of the filter by way of the second valve and the third valve to vent collected gas from the filter to the tank.

2. The liquid supply system of claim 1, wherein
the tank has a second gas collection space configured to collect the collected gas vented from the filter to the tank,
a gas release outlet is in communication with the second gas collection space, and
the first valve is a gas release valve coupled to the gas release outlet, the gas release valve being configured to release the gas collected in the second gas collection space from the tank.

3. The liquid supply system of claim 2, further comprising:
a sensor coupled to the gas release outlet, the sensor configured to
detect an amount of the gas collected in the second gas collection space, and
output a control signal to cause the gas release valve to open when the amount of the gas collected in the second gas collection space reaches a predetermined level.

4. The liquid supply system of claim 2, wherein the gas release valve is a manual valve, the gas release valve having an indicator configured to indicate an amount of the gas collected in the second gas collection space.

5. The liquid supply system of claim 2, wherein the third valve and the fourth valve are included in a valve arrangement, the valve arrangement being configured to be in a first position in which the third valve is open and the fourth valve is closed to selectively couple the first gas collection space of the filter to the tank to vent the collected gas from the filter to the tank, or in a second position in which the third valve is closed and the fourth valve is open to selectively couple the first gas collection space of the filter to the drainage line.

6. The liquid supply system of claim 5, further comprising:
a second piping coupled between the tank and the first gas collection space of the filter; and
a third piping coupled between an intermediate point of the second piping and the drainage line,
wherein
the second valve is coupled to the second piping between the intermediate point and the gas collection space of the filter, and
the fourth valve is coupled to the third piping between the intermediate point and the drainage line.

7. The liquid supply system of claim 5, further comprising:
a controller coupled to at least one of the valve arrangement or the gas release valve, the controller configured to perform at least one of
switching the valve arrangement from the first position to the second position in response to a number of dispensing operations reaching a predetermined value, or
opening the gas release valve in response to an amount of the gas collected in the second gas collection space reaching a predetermined level.

8. The liquid supply system of claim 2, wherein the feeding pump is coupled between the tank and an inlet of the filter, and the dispensing pump is coupled to an outlet of the filter.

9. The liquid supply system of claim 8, wherein at least one of the feeding pump or the dispensing pump is configured to perform a purging operation to move an un-dispensed portion of the liquid back to the tank.

10. The liquid supply system of claim 9, wherein the gas release valve is configured to be opened during the purging operation to release the gas collected in the second gas collection space from the tank under a pressure generated by the at least one of the feeding pump or the dispensing pump during the purging operation.

11. The liquid supply system of claim 2, further comprising:
an intermediate tank coupled between the container and the tank, the intermediate tank having
a third gas collection space configured to collect gas accompanying the liquid;
a further gas release outlet in communication with the third gas collection space; and
a further gas release valve coupled to the further gas release outlet of the intermediate tank, the further gas release valve configured to release the gas collected in the third gas collection space from the intermediate tank.

12. The liquid supply system of claim 2, further comprising a purge valve coupled to the first piping between the feeding pump and the dispensing pump.

13. The liquid supply system of claim 2, wherein the second gas collection space collects a greater amount of gas than the first gas collection space.

14. A liquid supply system, comprising:
a tank comprising:
a first inlet in a lower portion of the tank;
an outlet in the lower portion of the tank;
a second inlet in an upper portion of the tank; and
a gas release outlet in the upper portion of the tank;
a first piping having
opposite first and second ends, the second end of the first piping coupled to the first inlet of the tank; and
a first intermediate point between the first and second ends of the first piping;
a second piping having
opposite first and second ends, the first end of the second piping coupled to the first intermediate point of the first piping; and
a second intermediate point between the first and second ends of the second piping;
a gas release valve coupled between the gas release outlet and the second intermediate point of the second piping;
a first valve between a filter and the first intermediate point;
a valve arrangement coupled to the first piping and the second piping, the valve arrangement having
a second valve between the first intermediate point and the second intermediate point; and
a third valve between the first intermediate point and the tank,
wherein the valve arrangement is configured to be in one of
a first position in which the second valve and the third valve are in a state configured to couple the first end of the first piping to the first inlet of the tank, wherein in the first position one of the second valve or the third valve is shut off, and a second position in which the second valve and the third valve are in a state configured to couple the first end of the first piping to the second end of the second piping; and a dispensing mechanism coupled to the tank to receive liquid to be dispensed, the dispensing mechanism comprising the filter configured to filter the liquid before dispensing, a feeding pump configured to receive the liquid from the tank at a first port and move the liquid from the tank to the filter, a dispensing pump configured to move filtered liquid out of the filter to be dispensed, and a third piping coupled between the feeding pump and the dispensing pump and bypassing the filter, wherein the third piping is coupled to a second port of the feeding pump different from the first port, and wherein a portion of the filtered liquid in the dispensing pump is returned to the tank through the first port and the second port.

15. The liquid supply system of claim 14, further comprising:

a controller coupled to the gas release valve, the first valve, the second valve, and the third valve; and a bubble sensor coupled to the controller, the bubble sensor configured to detect an amount of gas collected in the tank, wherein the controller is configured to open or close the gas release valve, the first valve, the second valve, and the third valve, based on the amount of gas collected in the tank detected by the bubble sensor.

16. A method of supplying a liquid, the method comprising:

moving the liquid from a tank to a filter by a feeding pump via a first piping between the tank and the feeding pump;

filtering, by the filter, the liquid received from the tank;

dispensing filtered liquid by a dispensing pump, wherein the dispensing pump is coupled to the feeding pump by a second piping bypassing the filter;

collecting, in a gas collection space of the filter, gas from bubbles contained in the liquid;

controlling a first valve between the filter and the tank, a second valve between the first valve and the tank, a third valve between the first valve and a drainage line, and a fourth valve between the tank and the drainage line to vent collected gas from the filter to the tank;

controlling the first valve, the second valve, the third valve, and the fourth valve to vent the gas received from the filter to the drainage line;

controlling the first valve to supply the liquid to both of the second valve and the third valve regardless of a state of the second valve and the third valve; and purging unused filtered liquid in the dispensing pump to the tank through the feeding pump by controlling a purge valve coupled to the second piping and an inlet valve coupled to the first piping.

17. The method of claim 16, wherein the second valve is caused to be closed, the third valve is caused to be closed, and the fourth valve is caused to be opened to vent the gas received by the tank from the filter to the drainage line.

18. The method of claim 16, wherein the second valve is caused to be closed, the third valve is caused to be opened, and the fourth valve is caused to be closed to vent the gas received collected in the gas collection space of the filter to the drainage line.

19. The method of claim 16, wherein the liquid is moved from the tank to the filter by the feeding pump via a first opening in a bottom of the tank, and the collected gas is vented to the tank via a second opening in the bottom of the tank.

20. The method of claim 16, wherein the controlling of the first valve, the second valve, the third valve and the fourth valve is based on an amount of gas detected in the tank by a bubble sensor arranged between the fourth valve and the tank.

* * * * *